US007950619B2

(12) United States Patent
Takeda et al.

(10) Patent No.: US 7,950,619 B2
(45) Date of Patent: May 31, 2011

(54) FLUID DEVICE MOUNTING STRUCTURE

(75) Inventors: Hideyuki Takeda, Kasugai (JP);
Tetsuya Ishihara, Nagoya (JP)

(73) Assignee: CKD Corporation, Komaki (JP)

( * ) Notice: Subject to any disclaimer, the term of this patent is extended or adjusted under 35 U.S.C. 154(b) by 96 days.

(21) Appl. No.: 12/379,997

(22) Filed: Mar. 5, 2009

(65) Prior Publication Data

US 2009/0250561 A1    Oct. 8, 2009

(30) Foreign Application Priority Data

Apr. 3, 2008    (JP) ................................. 2008-096935

(51) Int. Cl.
*F16M 1/00*    (2006.01)

(52) U.S. Cl. ...... 248/639; 248/68.1; 248/74.4; 211/182; 285/61

(58) Field of Classification Search .................. 248/639, 248/68.1, 74.1, 74.4; 211/191, 206, 182; 285/61, 64, 124.2
See application file for complete search history.

(56) References Cited

U.S. PATENT DOCUMENTS

| | | | | |
|---|---|---|---|---|
| 3,850,812 A * | 11/1974 | Schneider | ...................... | 210/231 |
| 4,099,626 A * | 7/1978 | Magnussen, Jr. | ............ | 211/60.1 |
| 4,392,588 A * | 7/1983 | Scalera | ....................... | 222/129.4 |
| 4,601,447 A * | 7/1986 | McFarland | ...................... | 248/49 |
| 5,205,520 A * | 4/1993 | Walker | ......................... | 248/74.1 |
| 5,690,252 A * | 11/1997 | Oleksiewicz et al. | ........... | 222/56 |
| 5,769,112 A * | 6/1998 | Rendina | ........................ | 137/316 |
| 5,996,485 A * | 12/1999 | Suter et al. | ...................... | 100/37 |
| 6,053,456 A * | 4/2000 | Dispenza | ........................ | 248/56 |
| 6,189,736 B1 * | 2/2001 | Phallen et al. | .................. | 222/52 |
| 6,193,281 B1 * | 2/2001 | Nagai et al. | ..................... | 285/86 |
| 6,412,243 B1 * | 7/2002 | Sutelan | ........................ | 52/309.7 |
| 6,637,705 B2 * | 10/2003 | Berlam et al. | ................. | 248/68.1 |
| 6,902,138 B2 * | 6/2005 | Vantouroux | ................. | 248/68.1 |
| 7,077,382 B2 * | 7/2006 | Klinger | ........................ | 251/149.8 |
| 7,165,797 B2 * | 1/2007 | Karamanos | ................... | 294/142 |
| 7,537,183 B2 * | 5/2009 | Karamanos | ................. | 248/68.1 |
| 2001/0007342 A1 * | 7/2001 | McCracken | ................. | 248/68.1 |
| 2003/0167799 A1 * | 9/2003 | Tijerina-Ramos et al. | ....... | 65/68 |
| 2004/0124320 A1 * | 7/2004 | Vantouroux | ................. | 248/68.1 |
| 2005/0023207 A1 * | 2/2005 | Kirker et al. | ............. | 210/321.74 |
| 2007/0278171 A1 * | 12/2007 | Jersey et al. | ................... | 211/188 |
| 2009/0102109 A1 * | 4/2009 | Nuchter et al. | ................. | 269/71 |

FOREIGN PATENT DOCUMENTS

| | | |
|---|---|---|
| JP | A-10238681 | 9/1998 |
| JP | A-2007-002902 | 1/2007 |
| JP | A-2008-034872 | 2/2008 |
| KR | 20-0275750 | 11/2000 |

OTHER PUBLICATIONS

Feb. 18, 2011 Office Action issued in Korean Patent Application No. 10-2009-0028793 (with English Translation).

* cited by examiner

*Primary Examiner* — Terrell McKinnon
*Assistant Examiner* — Bradley H Duckworth
(74) *Attorney, Agent, or Firm* — Oliff & Berridge, PLC

(57) ABSTRACT

A fluid device mounting structure is provided for installing a plurality of fluid devices on a support assembly. The support assembly includes a support member for supporting connecting portions of the fluid devices by the support assembly, so that the fluid devices are freely disposed in three dimensions.

5 Claims, 22 Drawing Sheets

FLUID DEVICE MOUNTING STRUCTURE

CROSS-REFERENCE TO RELATED APPLICATIONS

This application is based upon and claims the benefit of priority from each of the prior Japanese Patent Application No. 2008-096935 filed on Apr. 3, 2008, the entire contents of which are incorporated herein by reference.

TECHNICAL FIELD

The present invention is related to a fluid device mounting structure for mounting fluid devices to be installed on a chemical liquid line.

BACKGROUND ART

In a manufacturing process of a semiconductor device, a cleaning treatment is conducted on a semiconductor wafer as a substrate. The wafer is cleaned by use of cleaning liquid such as a predetermined chemical liquid and pure water to remove contaminations such as particles, organic pollutants, and metallic impurities, organic substances, and oxidized films.

One example of a cleaning system is shown in FIGS. 22 and 23.

A cleaning system 1100 shown in FIGS. 22 and 23 includes an IN/OUT port 1101 for carrying in and out a wafer 1121; a stage 1102 for carrying the wafer 1121; a cleaning unit 1103 for cleaning the wafer 1121; a carrier cleaning unit 1104 for cleaning a carrier or carriers 1120; a carrier stock unit 1105 for storing the carrier(s) 1120; a power source unit 1106 for supplying electric power to each unit; and a chemical liquid storage unit 1107 for storing chemical liquid and others to be used for cleaning the wafer 1121.

These units 1101 to 1107 are covered by first to seventh casings 1111 to 1117 respectively in order to protect the wafer(s) 1121 and the carrier(s) 1120 from dust and dirt and to prevent the volatilized chemical liquid from leaking outside. A space between a second casing 1112 and a third casing 1113 is partitioned by a partition wall 1108, but an opening 1108a is provided in the partition wall 1108 to be opened and closed by use of a shutter 1109.

In the cleaning system 1100, the carrier(s) 1120 carrying the wafer(s) 1121 is conveyed from the IN/OUT port 1101 into the stage 1102 by a carrying mechanism 1110. Then, in the cleaning system 1100, the shutter 1109 is opened and the carrier(s) 1120 is transferred into the cleaning unit 1103 through the opening 1108a. Subsequently, the shutter 1109 is closed.

In the cleaning unit 1103, a chemical liquid is discharged onto the wafer(s) 1121 to conduct resist stripping, and pure water is then given to the wafer(s) 1121 for rinsing. Subsequently, a volatile chemical liquid (for example, isopropyl alcohol) is applied onto the whole wafer(s) 1121 for drying and then the wafer(s) 1121 is dried by blow drying or spin drying.

The cleaning system 1100 opens the shutter 1109 and conveys the carrier(s) 1120 loaded with the wafer(s) 1121 from the cleaning unit 1103 to the stage 1102. The carrier(s) 1120 is further conveyed to the IN/OUT port 1101 by the carrying mechanism 1110. The wafer(s) 1121 discharged to the IN/OUT port 1101 is finally taken out of the carrier(s) 1120 by an operator or an automated carrying apparatus. Thus, a series of wafer cleaning process is completed (see Patent Document 1).

As mentioned above, in the cleaning unit 1103, different kinds of fluids such as a chemical liquid, pure water, and a volatile liquid are supplied in turns. Further, concentration and flow rate of each of the fluids have large influence on the cleaning quality of the wafer(s) 1121. Therefore, the cleaning unit 1103 uses the following fluid devices: valves such as a flow rate control valve and an opening/closing valve; filters; sensors such as a pressure sensor and a flow rate sensor; and piping blocks such as a joint block and a passage block.

FIG. 21 shows one example of a connecting configuration of fluid devices of a fluid device unit. Specifically, a first connection part 203 of a first fluid device 201 and a second connection part 204 of a second fluid device 202 are connected via a seal member 205. A coupling member 206 is fitted in a first groove 203a and a second groove 204a formed on outer peripheral surfaces of the first and second connection parts 203 and 204 respectively. In this manner, the first and second fluid devices 201 and 202 are maintained in a connected relationship. In such the fluid device unit, the fluid devices are directly connected to each other, resulting in a reduced piping space and a reduced foot space (see Patent Document 2).

On the other hand, the fluid device unit has less rigidity in a connecting portion when it is only retained by the coupling member 206. Therefore, for example, when an operator lifts up the first fluid device 201 by hand for assembling the fluid device unit to the cleaning unit 1103, the connecting portions of the first and second connection parts 203 and 204 is bent and the second fluid device 202 is inclined with respect to the first fluid device 201 due to its own weight, causing deterioration of the sealing property of the connecting portions. Generally, a fluid device unit used for the cleaning unit 1103 includes numerous fluid devices for controlling several kinds of chemical liquids. Therefore, the connecting portions could be easily bent if the fluid devices are connected only by the coupling member 206, leading to laborious work.

In response to the above problem, heretofore, the fluid device unit is handled after the fluid devices 201 and 202 are assembled onto a bracket 211 and then on the cleaning unit 1103. In such the fluid device mounting structure, the bracket 211 prevents the fluid device unit from bending, so that the sealing property is not deteriorated due to the bending on the fluid device connecting portions.

Citation List

Patent Literature

Patent Document 1 JP2008-34872A
Patent Document 2 JP2007-2902A

SUMMARY OF INVENTION

Technical Problem

However, the conventional fluid device mounting structure has the following problems.

(1) In the conventional fluid device mounting structure, the fluid devices are mounted on the bracket 211 with reference to bottom surfaces of the fluid devices. However, in case that the fluid devices having different port heights (positions in the vertical direction) and mounting dimensions are mounted on the bracket 211, the port heights and the mounting dimensions of the fluid devices are required to be adjusted in advance. Therefore, in the conventional fluid device mounting structure, the bracket 211 has to be specially designed in compliance with types and locations of the fluid devices.

(2) Additionally, in the conventional fluid device mounting structure, since the fluid devices are two-dimensionally mounted on the bracket 211, ample empty space is required for arranging all the fluid devices in the same plane. Nowadays, a semiconductor manufacturing device has become more compact and hence the cleaning system 1100 has been downsized more and more. In accordance with this downsizing, the cleaning unit 1103 and the third casing 1113 are also downsized, so that the space between the third casing 1113 and the cleaning unit 1103 becomes smaller and the space is not always planar. Moreover, in accordance with diversification and high-precision of treatment of the wafer(s) 1121, the number and the types of fluid devices used for chemical liquid control have been increased. Consequently, there is a concern that the conventional fluid device mounting structure for mounting the fluid devices in two dimensions could not dispose all the fluid devices in empty space.

The present invention has been made to solve the above problems and has a purpose to provide a fluid device mounting structure capable of freely mounting fluid devices in three dimensions, thereby reducing an installation space for the fluid devices.

Solution to Problem

To achieve the above purpose, one aspect of the present invention provides a fluid device mounting structure comprising: a first fluid device; a second fluid device; and a support assembly on which the first and second fluid devices are mounted, wherein the first fluid device includes a first connection part having an outer peripheral surface formed with a mounting groove, and the second fluid device includes a second connection part having an outer peripheral surface formed with a mounting groove. The first and second connection parts are of identical shapes, and the support assembly includes a support member attached to the mounting grooves in a removable manner for supporting the connecting portions of the first and second connection parts by the support assembly.

DESCRIPTION OF EMBODIMENTS

A detailed description of preferred embodiments of a fluid device mounting structure embodying the present invention will now be given referring to the accompanying drawings.

First Embodiment

<Configuration of Fluid Device Unit>

Figure 14:
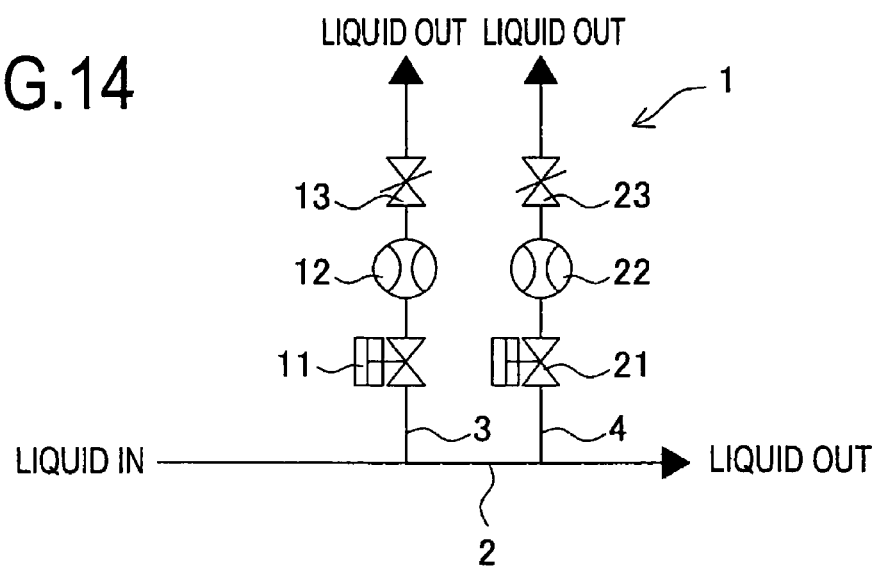
FIG. 14 is a circuit view of the fluid device unit shown in FIG. 1.

Similar to prior arts, a fluid device unit 1 shown in FIG. 14 is used in a cleaning system 1100. The fluid device unit 1 has a main passage 2 and first and second sub-passages 3 and 4 branched off from the main passage 2 to distribute a single kind of chemical liquid. The first sub-passage 3 is arranged with a first air-operated valve 11, a first flow meter 12, and a first flow rate control valve 13. The chemical liquid introduced to the first sub-passage 3 via the first air-operated valve 11 is measured in flow rate by the first flow meter 12, and the chemical liquid is controlled the flow rate by the first flow rate control valve 13. Subsequently, the chemical liquid is finally outputted. Similarly, the second sub-passage 4 is arranged with a second air-operated valve 21, a second flow meter 22, and a second flow rate control valve 23. The chemical liquid introduced to the second sub-passage 4 via the second air-operated valve 21 is measured in flow rate by the second flow meter 22, and the chemical liquid is controlled the flow rate by the second flow rate control valve 23. Subsequently, the chemical liquid is finally outputted.

<Overall Configuration of the Fluid Device Mounting Structure>

Figure 1:
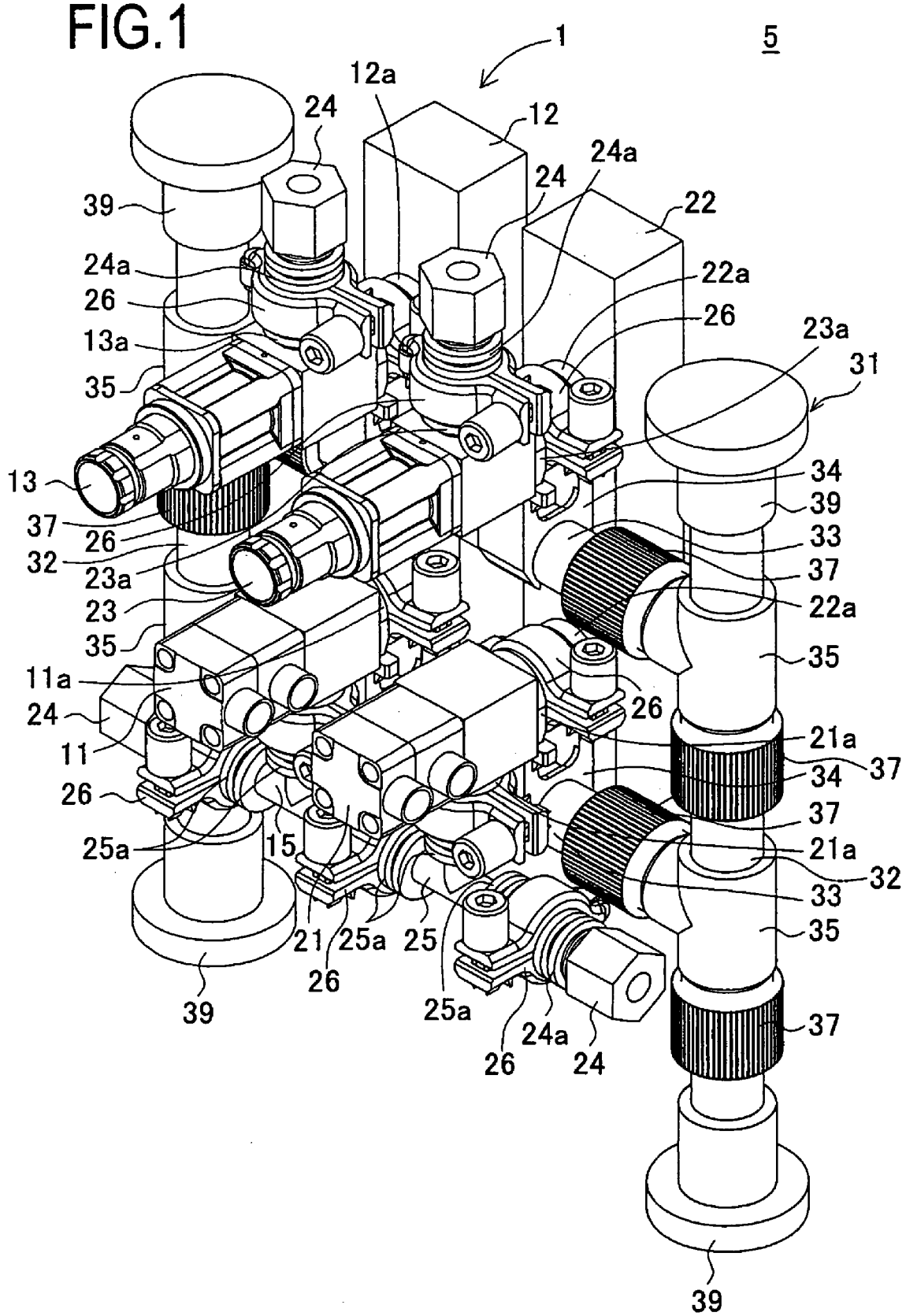
FIG. 1 is an external perspective view of a fluid device mounting structure in an embodiment of the present invention.

FIG. 1 shows an external perspective view of a fluid device mounting structure 5.

The fluid device unit 1 forms the main passage 2 by coupling a first branch pipe 15 and a second branch pipe 25 between a pair of joint blocks 24 (see FIG. 14). Further, the fluid device unit 1 provides the first sub-passage 3 by coupling the first air-operated valve 11, the first flow meter 12, the first flow rate control valve 13, and the joint block 24 and similarly provides the second sub-passage 4 by coupling the second air-operated valve 21, the second flow meter 22, the second flow rate control valve 23, and the joint block 24 (see FIG. 14). In the present embodiment, each joint block 24, the first and second branch pipes 15 and 25, the first and second air-operated valves 11 and 21, the first and second flow meters 12 and 22, and the first and second flow rate control valves 13 and 23 are examples of a "fluid device." From the viewpoint of corrosion-resistance, these fluid devices 11 to 13, 15, and 21 to 25 are configured with resin components without using any metal.

As shown in FIG. 1, the fluid devices 11 to 13, 15 and 21 to 25 are formed with connection parts 11a to 13a, 15a, and 21a to 25a of a common shape and are coupled to each other by use of identical connecting portion sealing structures which will be described later.

In the fluid device mounting structure 5, the fluid devices 11 to 13, 15 and 21 to 25 are mounted on a support assembly 31. In the fluid device mounting structure 5, the support assembly 31 is constituted by assembling holding frames 32 and supporting frames 33 in a lattice pattern to support each connecting portion of the fluid devices 11 to 13, 15, and 21 to 25 by the supporting frames 33.

<Sealing Structure for Connecting Portion>

Figure 6:
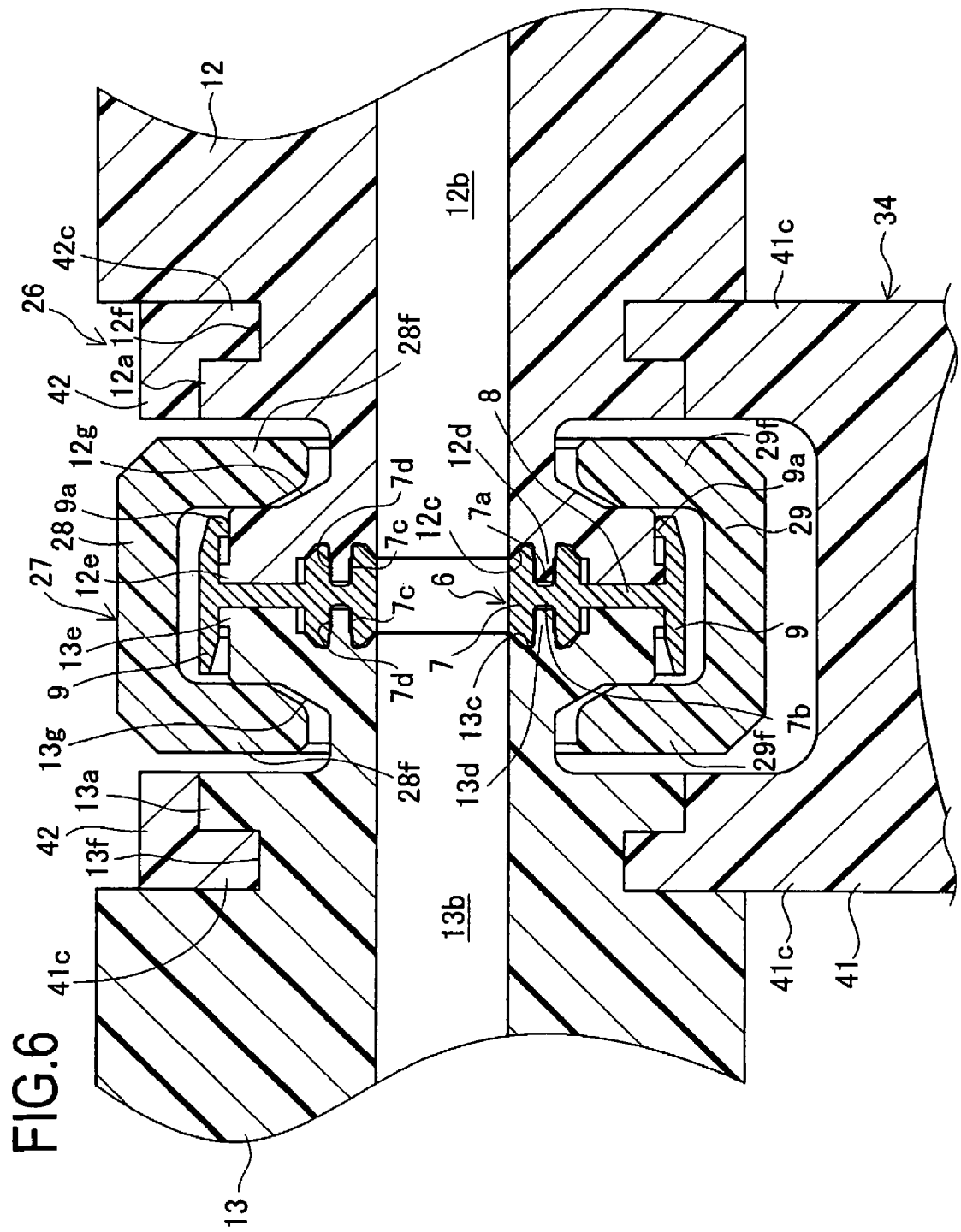
FIG. 6 is an enlarged sectional view of a connecting portion sealing structure shown in FIG. 1.
Figure 7:
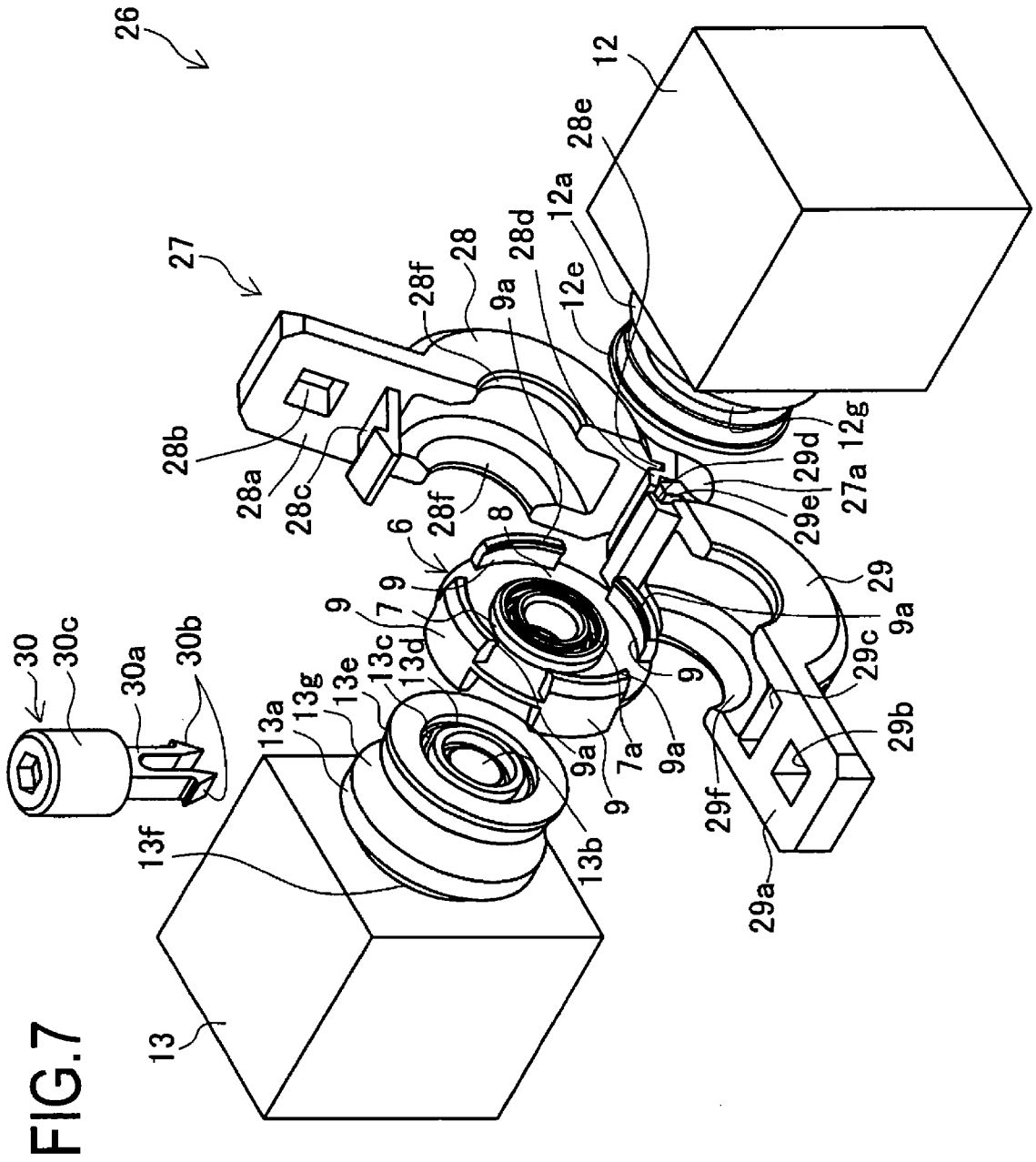
FIG. 7 is an exploded perspective view of the connecting portion sealing structure shown in FIG. 6.

A sealing structure 26 for connecting portion is now explained in detail exemplifying a connecting portion of the connection part 12a of the first flow meter 12 and a connecting portion of the connection part 13a of the first flow rate control valve 13 with reference to a sectional view of FIG. 6 and an exploded perspective view of FIG. 7. In FIGS. 6 and 7, illustration of other components except the connection parts 12a and 13a of the first flow meter 12 and the first flow rate control valve 13 are simplified.

As shown in FIGS. 6 and 7, the connection part 12a of the first flow meter 12 and the connection part 13a of the first flow rate control valve 13 are made of fluorocarbon resin such as PTFE having thermal resistance and corrosion resistance. The connection parts 12a and 13a are cylindrically shaped and formed with passages 12b and 13b opening on end surfaces of the connection parts 12a and 13a, respectively. Further, on the end surfaces of the connection parts 12a and 13a, sealing grooves 12c and 13c are formed on peripheries of the passage opening portions. Annular protrusions 12d and 13d are protruded coaxially with the passages 12b and 13b on circumferences of the sealing grooves 12c and 13c, creating annular groove-ridge lines. The connection parts 12a and 13a are further formed with annular flanges 12e and 13e outwardly protruding along outer peripheries of the end surfaces.

On outer peripheral surfaces of the connection parts 12a and 13a, mounting grooves 12f and 13f are annularly formed. Inner surfaces of the mounting grooves 12f and 13f which are closer to the end surfaces of the connection parts 12a and 13a are formed in parallel with the end surfaces of the connection parts 12a and 13a respectively so that the end surfaces of the connection parts 12a and 13a are brought into uniform contact with each other when the connection parts 12a and 13a are drawn or clamped toward each other by a holding jig 50 which will be described later. The connection part 12a is formed with an attaching groove 12g between the mounting groove 12f and the end surface of the connection part 12a to join a coupling member 27 for maintaining the connected state of the connection part 12a and similarly, the connection part 13a is formed with an attaching groove 13g between the mounting groove 13f and the end surface of the connection part 13a to join the coupling member 27 for maintaining the connected state of the connection part 13a. The mounting grooves 12f and 13f and the attaching grooves 12g and 13g are of annular shapes so that the coupling member 27 and a support member 34 described later may be mounted in any orientation. Thereby, the fluid devices can be easily attached and detached.

As shown in FIG. 7, the coupling member 27 is formed with a first divided part 28 and a second divided part 29 being connected together via a hinge 27a. The first divided part 28, the second divided part 29, and the hinge 27a are made of fluorocarbon resin having sufficient strength and corrosion resistance such as PVDF (polyvinylidene fluoride) formed by way of injection molding, cutting, or other techniques.

The first and second divided parts 28 and 29 are formed with first and second engagement protrusions 28d and 29d and first and second engagement recesses 28e and 29e in end portions connected by the hinge 27a. The first protrusion 28d is fitted and engaged in the second recess 29e and the second protrusion 29d is fitted and engaged in the first recess 28e in different directions, i.e., in the direction of separating the first and second divided parts 28 and 29 and in the direction perpendicular to the separating direction. The coupling member 27 is designed to rotate the first and second divided parts 28 and 29 about the above fitting portions.

The first and second divided parts 28 and 29 are formed with extended portions 28a and 29a extending in the radial direction toward the other ends opposite from the end portions connected by the hinge 27a. The extended portion 29a is formed with a through hole 29c and the extended portion 28a is formed with a locking portion 28c in a protruding form. The locking portion 28c is bent or deformed to pass through the through hole 29c and then restored to its original shape and hooked on the extended portion 29a. Thereby, the first and second divided parts 28 and 29 are joined to each other so that the extended portions 28a and 29a are spaced with an appropriate clearance.

As shown in FIG. 6, the first and second divided parts 28 and 29 are formed with projections 28f and 29f which contact with inner walls of the attaching grooves 12g and 13g closer to the end surfaces of the connection parts 12a and 13a when the connection parts 12a and 13a are connected via the seal member 6. As shown in FIG. 7, the extended portions 28a and 29a are opened (separated) while the first and second engagement protrusions 28d and 29d of the first and second divided parts 28 and 29 are fitted in the second and first engagement recesses 29e and 28e respectively. After that, the locking portion 28c is inserted in the through hole 29c to be engaged with the extended portion 29a so that the projections 28f and 29f are respectively disposed in the attaching grooves 12g and 13g of the connection parts 12a and 13a. As a consequence, the projections 28f and 29f of the divided parts 28 and 29 apply a reactive force against a repulsive force of the seal member 6 to the connection parts 12a and 13a, thus maintaining the connection parts 12a and 13a in a connected relation.

The connection parts 12a and 13a and the coupling member 27 are made of resin. Accordingly, if a high-temperature chemical liquid and cool pure water flow in turns in the passages 12b and 13b, the connection parts 12a and 13a and the coupling member 27 will repeatedly expand and contract, causing deterioration of the sealing performance. For preventing such a problem, the coupling member 27 is provided with a fixing pin 30 for supplementary tightening.

The fixing pin 30 is configured with a pin portion 30a and a nut member 30c which are made of fluorocarbon resin having sufficient strength and corrosion resistance such as PVDF (polyvinylidene fluoride). The pin portion 30a has a bifurcated end easy to insert into insertion holes 28b and 29b formed in the extended portions 28a and 29a. The distal end of the pin portion 30a is formed with hook portions 30b. The nut member 30c is threadedly engaged with a proximal end of the pin portion 30a. When the nut member 30c is threaded into the pin portion 30a, the thus configured fixing pin 30 draws the extended portions 28a and 29a closer so that a taper formed on each inner periphery of the end portions of the projections 28f and 29f slides on a taper formed in each of the attaching grooves 12g and 13g of the connection parts 12a and 13a. In this manner, the connection parts 12a and 13a come closer to each other, thus the sealing strength is enhanced.

As shown in FIGS. 6 and 7, the seal member 6 includes an annular main body 7 and a web portion 8 radially outwardly extending from an outer periphery of the main body 7. On an outer edge of the web portion 8, holding portions 9 are intermittently provided.

The main body 7 is formed, on both surfaces, with annular grooves 7a and 7b in which the annular protrusions 12d and 13d of the connection parts 12a and 13a will be fitted respectively. Accordingly, the main body 7 has an H-shaped cross-section. The annular grooves 7a and 7b are formed to have a groove width (in a vertical direction in FIG. 6) equal to or slightly larger than a width (thickness) of each of the annular protrusions 12d and 13d of the connection parts 12a and 13a. Each of the annular grooves 7a and 7b is formed with press-fit allowances 7c and 7d in inside and outside inner walls located inward from an opening, so that the groove widths of the annular grooves 7a and 7b located inward from the opening are made smaller than the widths of the annular protrusions 12d and 13d in the thickness direction. Therefore, when the annular protrusions 12d and 13d are press-fitted in the press-fit allowances 7c and 7d of the annular grooves 7a and 7b, the seal member 6 provides sealing in the radial direction of the passages 12b and 13b. The web portion 8 is a film-like portion and provided with a plurality of the holding portions 9 on the outer edge. Each holding portion 9 is formed with a hooked end 9a to be engaged with the annular flanges 12e and 13e of the connection parts 12a and 13a.

<Configuration of Support Assembly>

Figure 2:
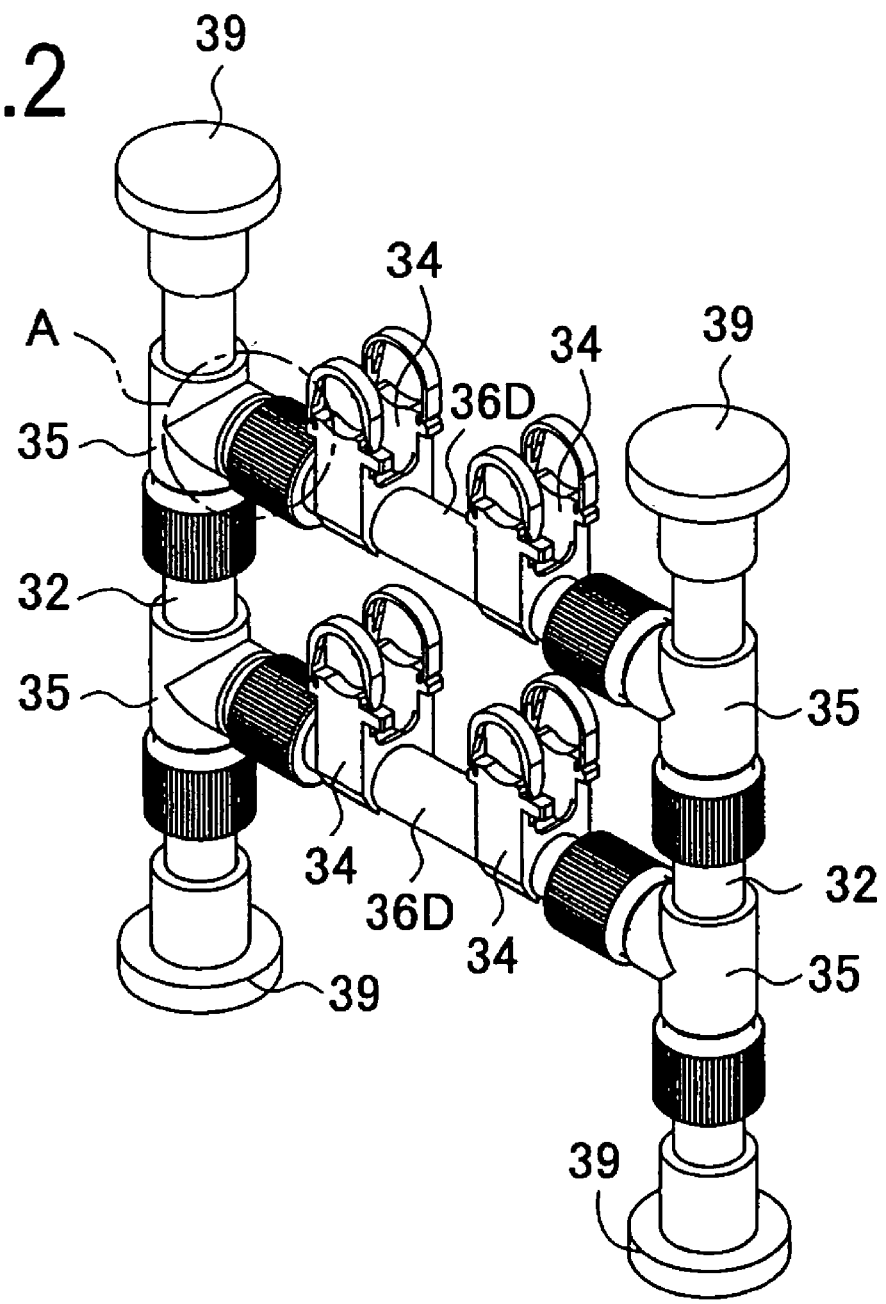
FIG. 2 is an external perspective view of a support assembly shown in FIG. 1.
Figure 3:
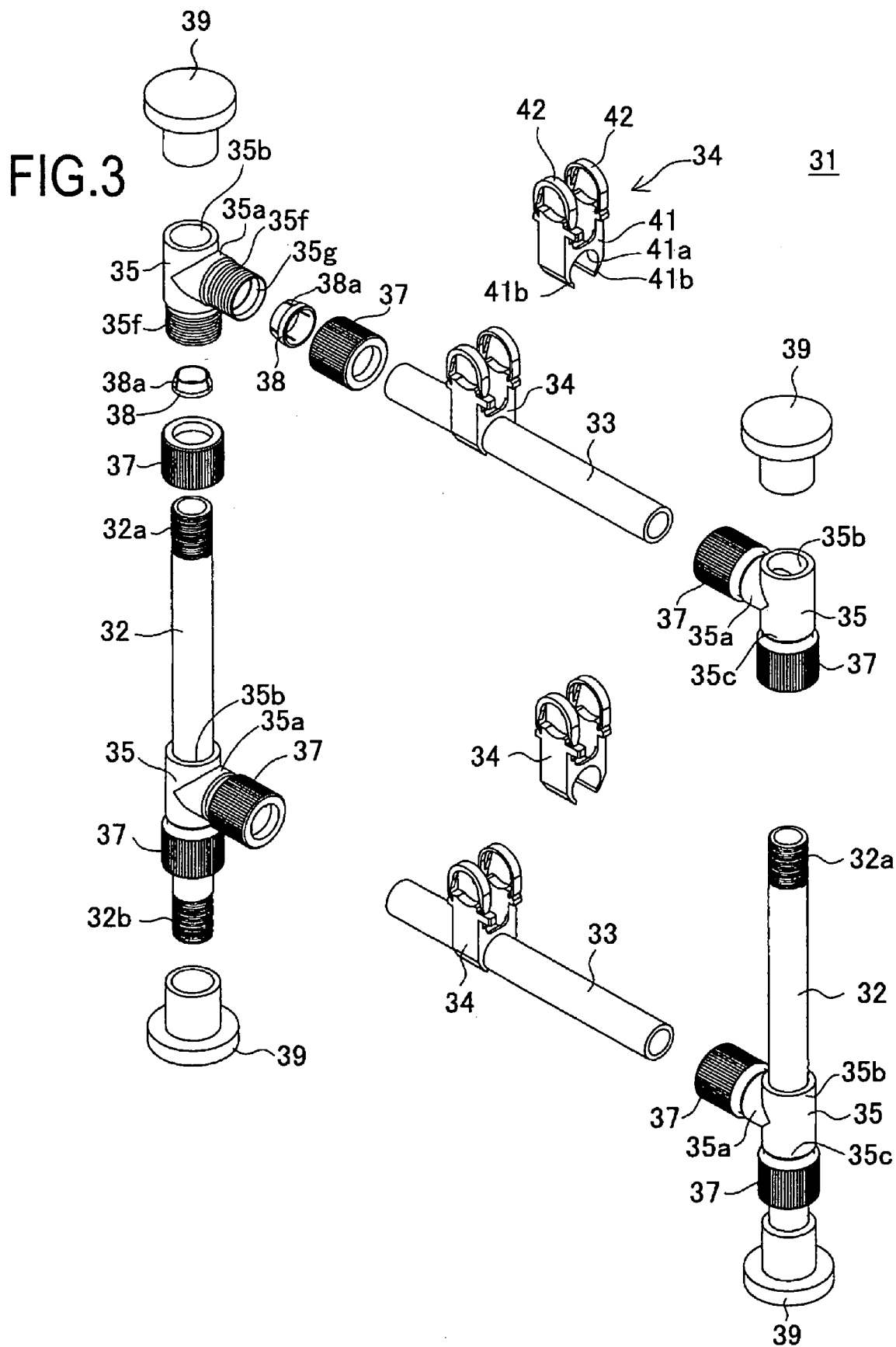
FIG. 3 is an exploded perspective view of the support assembly shown in FIG. 2.

Configuration of the support assembly 31 is now explained. FIG. 2 is an external perspective view of the support assembly 31 shown in FIG. 1. FIG. 3 is an exploded perspective view of the support assembly 31 shown in FIG. 2.

As shown in FIGS. 2 and 3, the support assembly 31 includes two supporting frames 33 held between holding frames 32. Positioning members 35 are attached to opposite ends of each supporting frame 33 to position and hold the supporting frames 33 with respect to the holding frames 32.

The supporting frame 33 and the holding frame 32 are pipes made of resin. The holding frame 32 is formed at both ends with external threads 32a and 32b on each outer periphery. A cap 39 is screwed on each of the external treads 32a and 32b. Therefore, each holding frame 32 can adjust its overall length by adjusting a screwing amount of each cap 39 on the external threads 32a and 32b.

The positioning member 35 is formed with a hollow hole 35b in which the holding frame 32 is slidably inserted. On the outer peripheral surface of the positioning member 35, a supporting frame holding portion 35a is formed in the direction orthogonal to the axial direction of the hollow hole 35b. The holding portion 35a is formed with an insert portion 35g in which the supporting frame 33 is slidably inserted. The holding portion 35a is further formed with an external thread 35f on an outer peripheral surface thereof, which is screw-threaded with a nut member 37 via a wedge member 38.

Figure 4:
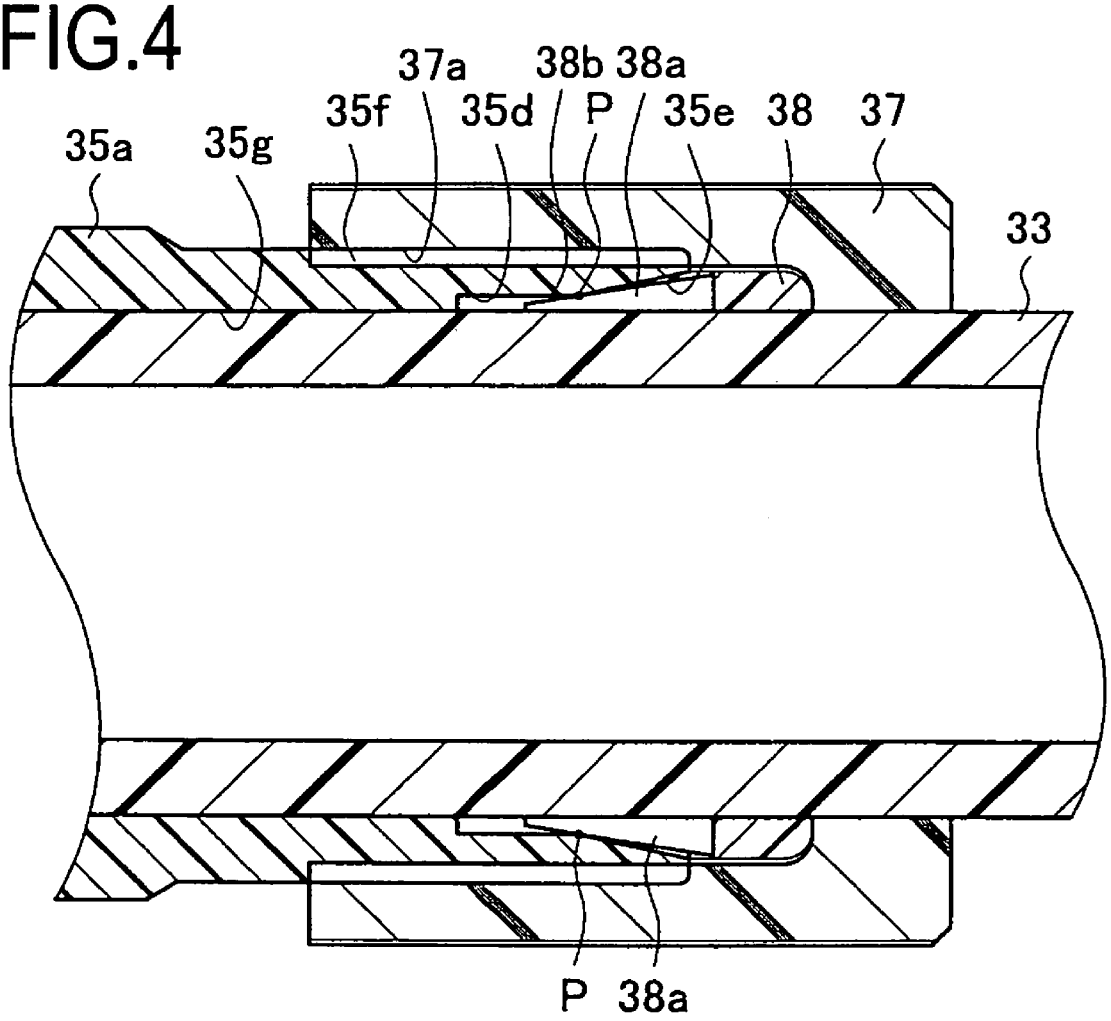
FIG. 4 is an enlarged sectional view of a part A shown in FIG. 2.

As shown in an enlarged sectional view of FIG. 4, the wedge member 38 is cylindrically shaped and provided with a plurality of slits 38a cut to extend from one open end in the axial direction. An outer peripheral surface of the wedge member 38 has a taper 38b that decreases the outer diameter toward the open end with cuts. An inner peripheral surface of the insert portion 35g is formed with an annular large-diameter portion 35d. An inner peripheral surface of the large-diameter portion 35d on an open end side has a taper 35e that decreases the inner diameter from the open end in the direction parallel with the axial direction of the supporting frame holding portion 35a (the insert portion 35g). The taper angle of the taper 35e is larger than that of the taper 38b of the wedge member 38.

The wedge member 38 is attached onto the supporting frame 33 in a manner that the smaller-diameter open end formed with the slits 38a faces the positioning member 35. The wedge member 38 is pressed toward the supporting frame holding portion 35a by the screw force generated when an internal thread 37a of the nut member 37 is screwed onto the external thread 35f of the supporting frame holding portion 35a. At that time, the smaller-diameter end of the wedge member 38 is inserted into a clearance created between the large-diameter portion 35d of the holding portion 35a and the supporting frame 33. Then, the taper 38b comes into line contact with the taper 35e of the large-diameter portion 35d at a point P, so that the diameter of the wedge member 38 is fixedly fitted on the supporting frame 33. As above, the positioning member 35 is connected to the end of the supporting frame 33.

As shown in FIG. 3, the holding frame 32 is inserted in the nut member 37 and the wedge member 38, and further slidably inserted into the hollow hole 35b of the positioning member 35. Similar to the supporting frame holding portion 35a, the positioning member 35 is formed with the external thread 35f in an outer periphery of one open end. When the positioning member 35 slides on the holding frame 32 to a certain position, the nut member 37 is screwed onto the external thread 35f via the wedge member 38, so that the holding frame 32 is fastened by the wedge member 38. Consequently, the positioning member 35 is fixed to the certain position of the holding frame 32. In addition, the mechanism of fixing the positioning member 35 to the holding member 32 is similar to that of the positioning member 35 to the supporting member 33, hence detailed explanation is omitted.

The above mentioned holding frame 32, the supporting frame 33, the positioning member 35, the nut member 37, the wedge member 38, and the cap 39 are made of resin with high strength and corrosion resistance such as polyvinyl chloride, polyethylene (PE), polypropylene (PP), polystyrene (PS), polytetrafluoroethylene (PTFE), ABS resin (acrylonitrile butadiene styrene resin), and acrylic resin (PMMA).

<Support Member>

As shown in FIG. 3, the support member 34 is attached to for example the mounting grooves 12f and 13f of the connection parts 12a and 13a in a removable manner (see FIG. 6) so that the connecting portions of the connection parts 12a and 13a is supported by the supporting frame 33. The support member 34 includes a main body 41 which is mounted on the supporting frame 33 and coupling portions 42 which are fitted in the mounting grooves 12f and 13f and further engaged with the main body 41. The support member 34 is thus attached to the supporting frame 33 in a removable manner.

Figure 5:
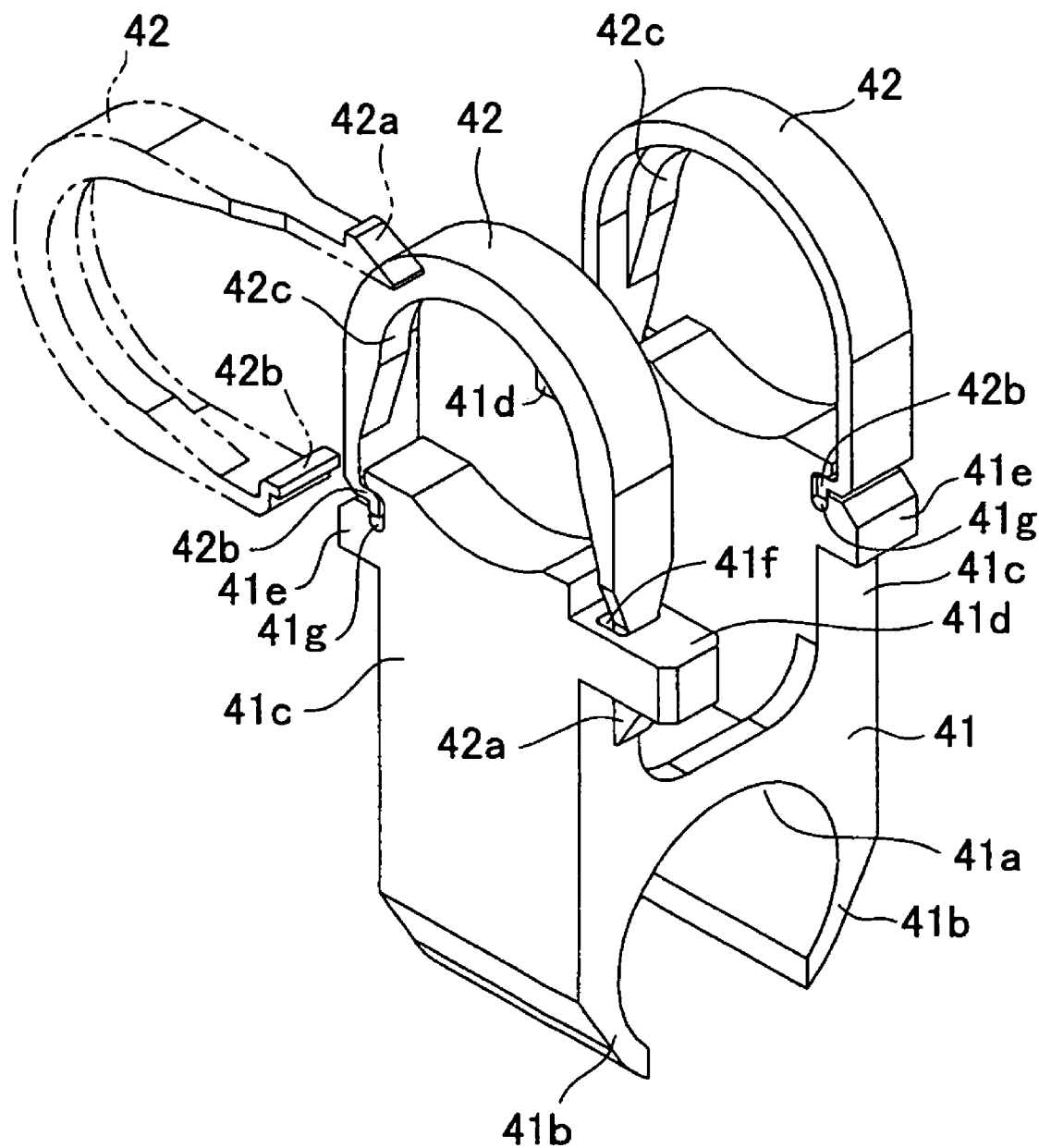
FIG. 5 is an external perspective view of a support member shown in FIG. 2.

The body 41 and the coupling portions 42 as shown in an external perspective view of FIG. 5 are formed by injection molding, cutting, and other techniques with fluorocarbon resin having sufficient strength and corrosion resistance such as PVDF (polyvinylidene fluoride).

The main body 41 is formed with a clamp portion 41a having a C-shape opening in one end of the body 41. The clamp portion 41a is fitted on the supporting frame 33 so that the body 41 is mounted on the supporting frame 33 in a removable manner. In the body 41, the clamp portion 41a is designed to have an inner diameter smaller than a diameter of the supporting frame 33 and a thickness thinner around the open end to provide elastically deformable flexible parts 41b. The body 41 is mounted on the supporting frame 33 in such a manner that the flexible parts 41b are elastically outwardly deformed to fit the clamp portion 41a onto the supporting frame 33, and then the flexible parts 41b are restored, thereby grasping the supporting frame 33.

The main body 41 is further formed with extended portions 41c extending upward from the flexible parts 41b. On the extended portions 41c, for example, the mounting grooves 12f and 13f of the connection parts 12a and 13a will be disposed (see FIG. 6). In FIG. 5, at an upper end of each extended portion 41c, a first engagement portion 41d and a second engagement portion 41e are provided to be engaged with both ends of the coupling portion 42 in different configurations. The first engagement portions 41d are located on opposite sides between the extended portions 41c, i.e., in a diagonal position to prevent the coupling portions 42 from easily disengaging from the first engagement portions 41d and similarly, the second engagement portions 41e are located on opposite sides between the extended portions 41c, i.e., in a diagonal position to prevent the coupling portions 42 from easily disengaging from the second engagement portions and 41e.

Each coupling portion 42 is an elastically deformable U-shaped belt. The coupling portion 42 is formed with an engagement hook 42a at one end and a fitting piece 42b at the other end. The fitting piece 42b has a dogleg shape by being bent at a right angle with respect to the coupling portion 42 and then again at a right angle. On an inner peripheral surface of each coupling portion 42, as shown in FIG. 6, a protrusion 42c is provided to be fitted in the mounting groove 12f or 13f.

As shown in FIG. 5, the first engagement portion 41d of the body 41 is formed with an insertion hole 41f in which the engagement hook 42a is inserted so that the first engagement portion 41d is engaged with a distal end of the engagement hook 42a.

On the other hand, the second engagement portion 41e of the body 41 is formed with a fitting recess 41g in which the fitting piece 42b can be fitted. The fitting recess 41g is formed to horizontally open in a side surface of the second engagement portion 41e and be bent down to have a closed end in the second engagement portion 41e.

In the support member 34 configured as mentioned above, one end of each coupling portion 42 is engaged with the first engagement portion 41d by inserting the engagement hook 42a into the insertion hole 41f and the other end of the coupling portion 42 is engaged with the second engagement portion 41e by fitting the fitting piece 42b in the fitting recess 41g. This state of the coupling portion 42 is referred to as an "engaged position." When each coupling portion 42 is rotated by 180 degrees from the engaged position that the fitting piece 42b is fitted in the fitting recess 41g, the end of the fitting piece 42b is moved to the open end of the fitting recess 41g and thus the fitting piece 42b can be released from the fitting recess 41g. This state of the coupling portions 42 is referred to as a "releasable position."

<Installation Method for Fluid Device Unit>

A method for installing the fluid device unit 1 in FIG. 1 to the cleaning system 1100 is now explained.

For example, when there is a space in the third casing 1113 between the cleaning unit 1103 and a side wall of the third casing 1113 in the vertical direction, an operator stands the holding frames 32 vertically to set up the fluid device unit 1 in the space. After setting up the fluid device unit 1 in the space, the operator rotates the caps 39 individually with respect to the holding frames 32 so that the flat (top or bottom) surface of each cap 39 is pressed against a peripheral device or a wall in order to adjust the overall length of the holding frames 32. Thereby, the holding frames 32 are retained in a stretched state in the space. As a result, the fluid device unit 1 can be prevented from falling down inside the space.

If displacement of the fluid devices 11 to 13, 15, and 21 to 25 is caused due to the adjustment of the overall length of the holding frames 32, the operator loosens the nut member(s) 37 fastened to fix the positioning members 35 to the holding frames 32 and moves the positioning member(s) 35 to an appropriate position(s). Then, the operator tightens the nut member(s) 37 on the positioning members 35 again to fix the positioning members 35 to the holding frames 32.

Consequently, even if there is not enough space between the cleaning unit 1103 and the third casing 1113, the support assembly 31 can be set up to correspond to the size of the space by loosening and fastening the caps 39 or the nut members 37. Therefore, it is not necessary to use any additional tools to install the support assembly 31 in the cleaning system 1100, so that the fluid devices 11 to 13, 15, and 21 to 25 can be easily arranged in the opening space.

<Method of Attaching and Removing Fluid Devices>

Method for attaching and removing the fluid devices to and from the support assembly 31 is now explained by exemplifying maintenance of the first flow rate control valve 13.

Figure 8:
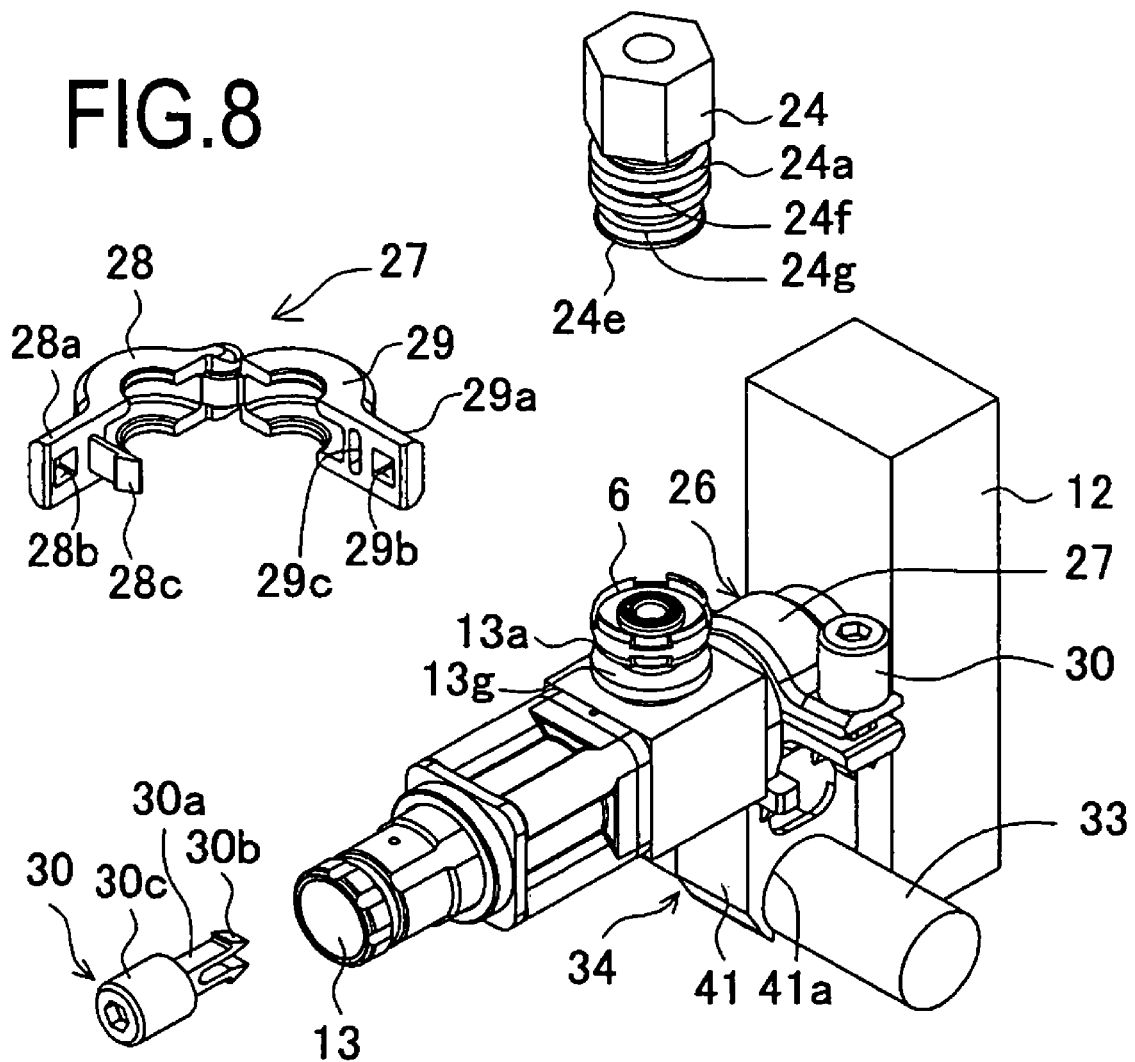
FIG. 8 is an explanatory view showing a process for dismounting a flow rate control valve in FIG. 1 from a fluid device unit, showing a state that a joint block is detached from the flow rate control valve.

First, as shown in an exploded perspective view of FIG. 8, the fixing pin 30 is pulled out from the coupling member 27 which connects the first flow rate control valve 13 and the joint block 24. Subsequently, the engagement portion 28c is detached from the through hole 29c to separate the first divided part 28 from the second divided part 29. In this state, the first and second divided parts 28 and 29 are not taken apart because they are still connected by the hinge 27a, so that the coupling member 27 is easy to handle. Afterwards, the joint block 24 is pulled up to separate a connection part 24a from the connection part 13a of the flow rate control valve 13. At this time, the seal member 6 does not fall off but remains in either the connection part 13a or 24a with the hook portion 9a being hooked on either the annular flange 13e or 24e of the connection part 13a or 24a.

Figure 9:
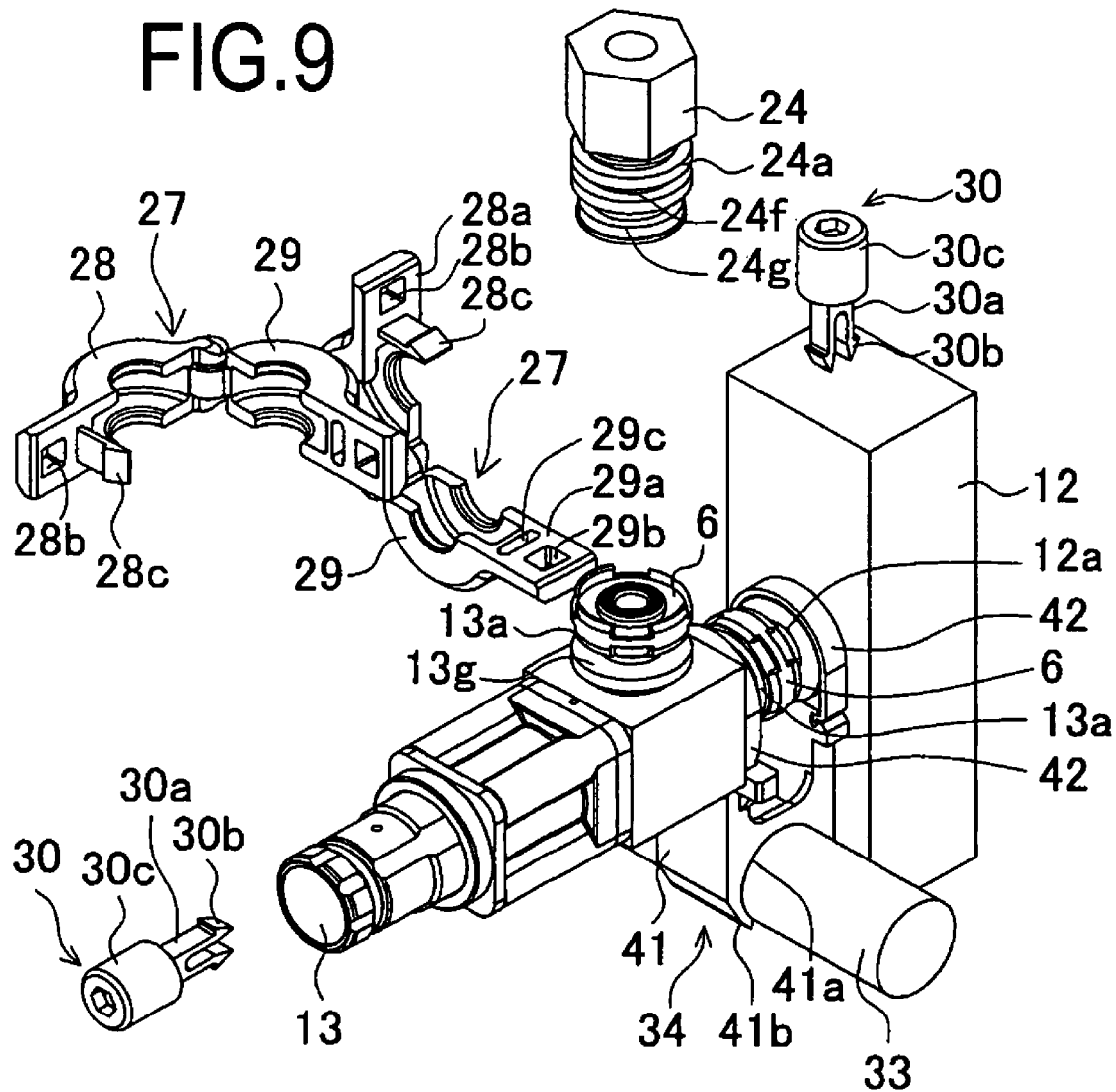
FIG. 9 is an explanatory view showing a process for dismounting the flow rate control valve in FIG. 1 from the fluid device unit, showing a state that a coupling member is detached from the flow rate control valve and a flow meter.

Secondary, as shown in an exploded perspective view of FIG. 9, the coupling member 27 coupling the connection part 13a of the first flow rate control valve 13 with the connection part 12a of the first flow meter 12 is detached in the same manner with the joint block 24 as mentioned above. Here, the support member 34 is fixed to the connection parts 12a and 13a, so that the protrusions 42c of the coupling portions 42 are fitted in the mounting grooves 12f and 13f (see FIG. 6), and thus the connection parts 12a and 13a are supported by the supporting frame 33 via the support member 34.

Figure 10:
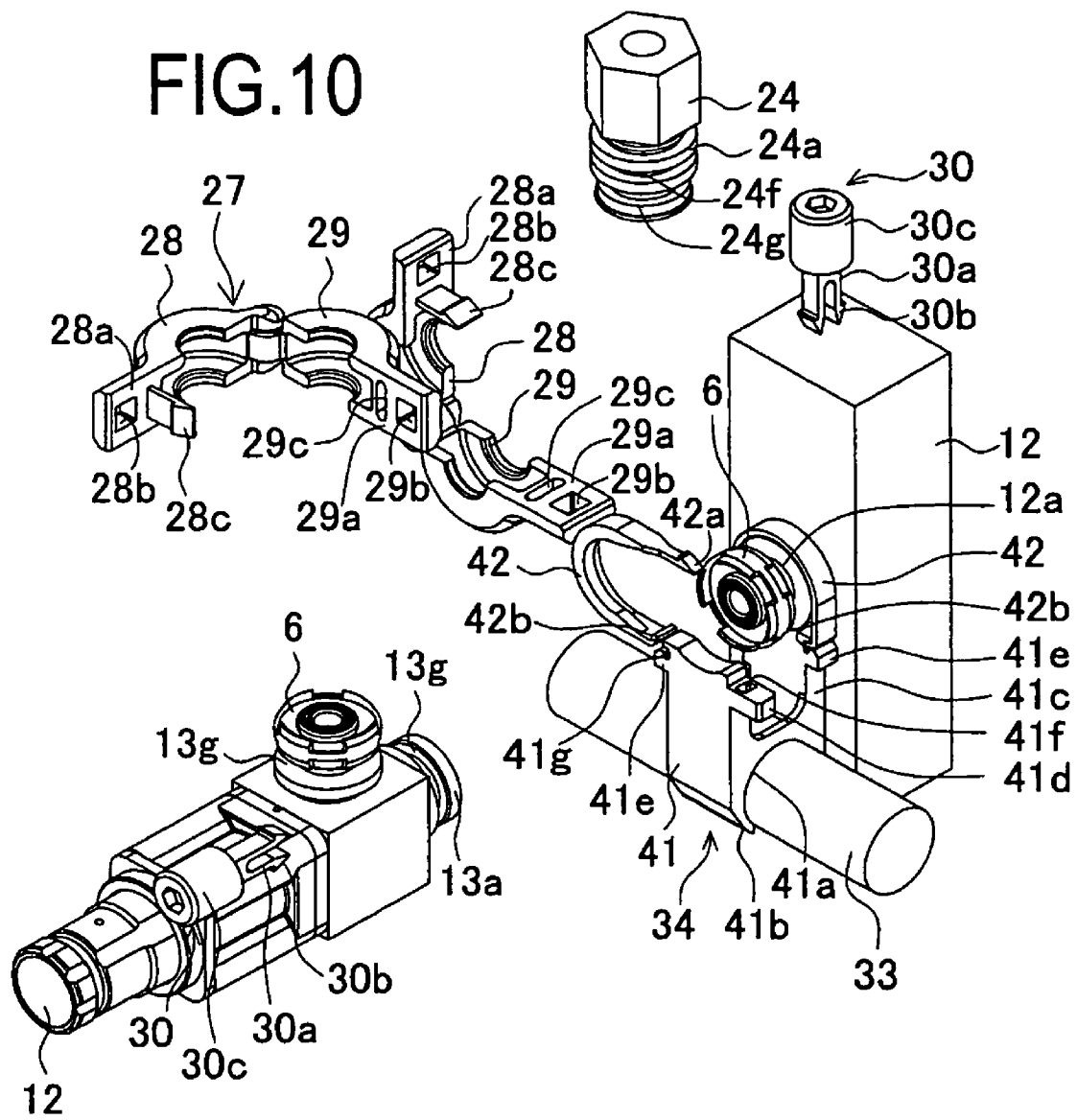
FIG. 10 is an explanatory view showing a process for dismounting the flow rate control valve in FIG. 1 from the fluid device unit, showing a state that the flow rate control valve is detached from the flow meter.

Accordingly, as shown in an exploded perspective view of FIG. 10, one of the coupling portions 42 of the support member 34 connected with the first flow rate control valve 13 is detached from the mounting groove 13f. Specifically, the engagement hook 42a is pulled out from the insertion hole 41f of the first engagement portion 41d to rotate the coupling portion 42 from the engaged position to the releasable position, and then the protrusion 42c and the mounting groove 13f are disconnected. Thereby, the connection part 13a is not anymore supported by the supporting frame 33 and hence the first flow rate control valve 13 is pulled in the opposite direction from the first flow meter 12 to separate the connection part 13a from the connection part 12a. At this time, the seal member 6 is prevented from falling off because the hook portions 9a of the seal member 6 remains hooked on the hook portion 12e or 13e of the connection part 12a or 13a.

The fitting piece 42b of the coupling portion 42 located in the releasable position can be pulled out from the fitting recess 41g to detach the coupling portion 42 from the main body 41. Accordingly, the coupling portion 42 will not stick to or catch on the connection part 13a during a detachment work of the first flow control valve 13.

Figure 11:
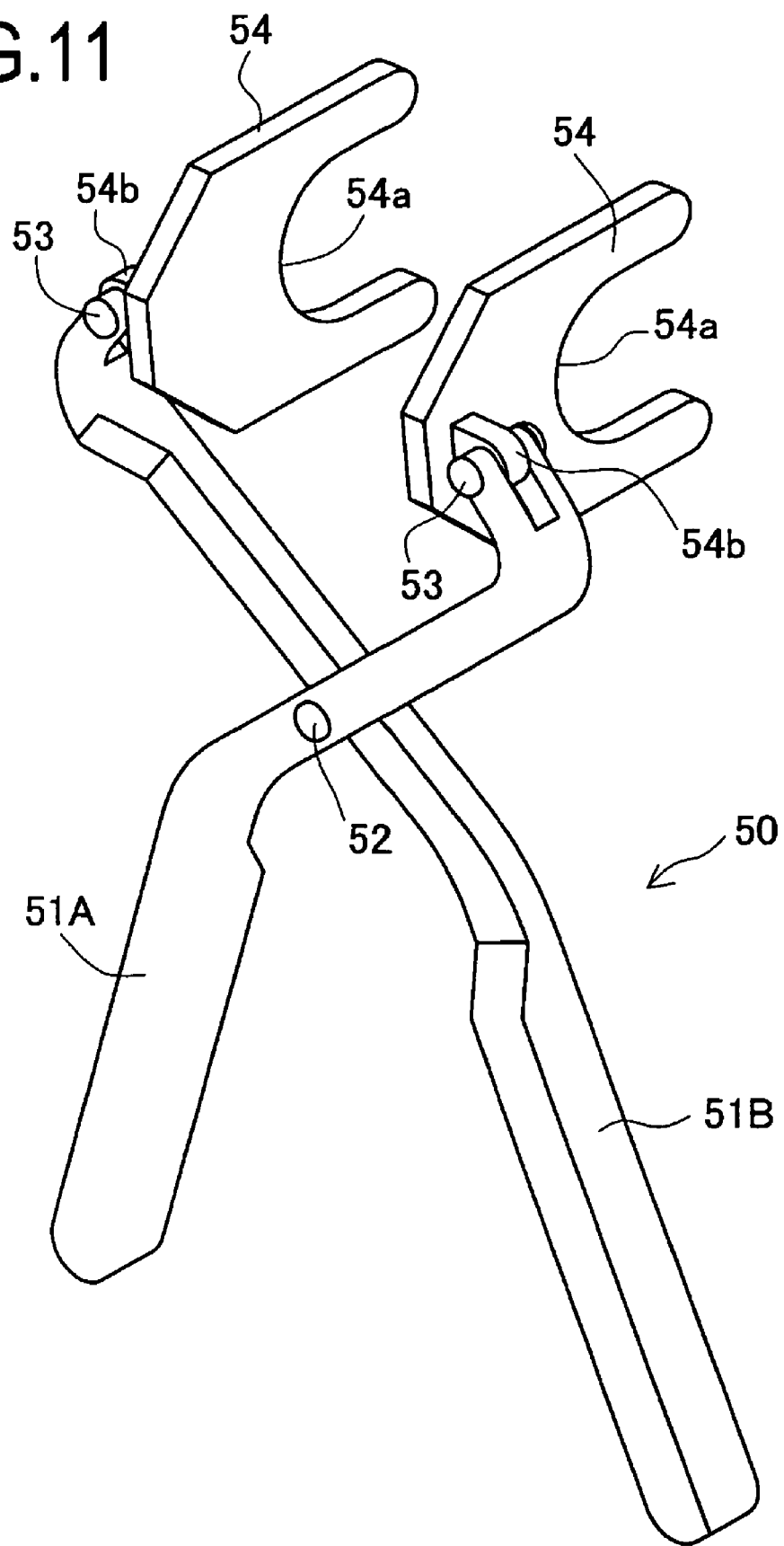
FIG. 11 is an external perspective view showing a jig for coupling a first connection part and a second connection part in the connecting portion sealing structure shown in FIG. 6.

After the maintenance of the first flow rate control valve 13 is completed, the coupling portion 42 attached to the first flow meter 12 in FIG. 10 is detached from the mounting groove 12f in the same manner as mentioned above prior to attachment of a holding jig 50 illustrated in FIG. 11 to the mounting grooves 12f and 13f.

The holding jig 50 shown in FIG. 11 is made of metal (such as stainless steel) with rigidity for preventing deformation when the jig transmits force. The holding jig 50 has two handles 51A and 51B which are rotatably connected each other at an intersection 52. Each of the handles 51A and 51B has an inwardly bent end in which a spindle 53 is provided in the orthogonal direction with respect to the rotating direction. In each spindle 53, a retaining portion 54b of a pressurizing plate 54 is provided in a rotatable manner. The pressurizing plate 54 is formed with a U-shaped groove 54a to be fitted in for example the mounting groove 12f of the connection part 12a or the mounting groove 13f of the connection part 13a.

Figure 12:
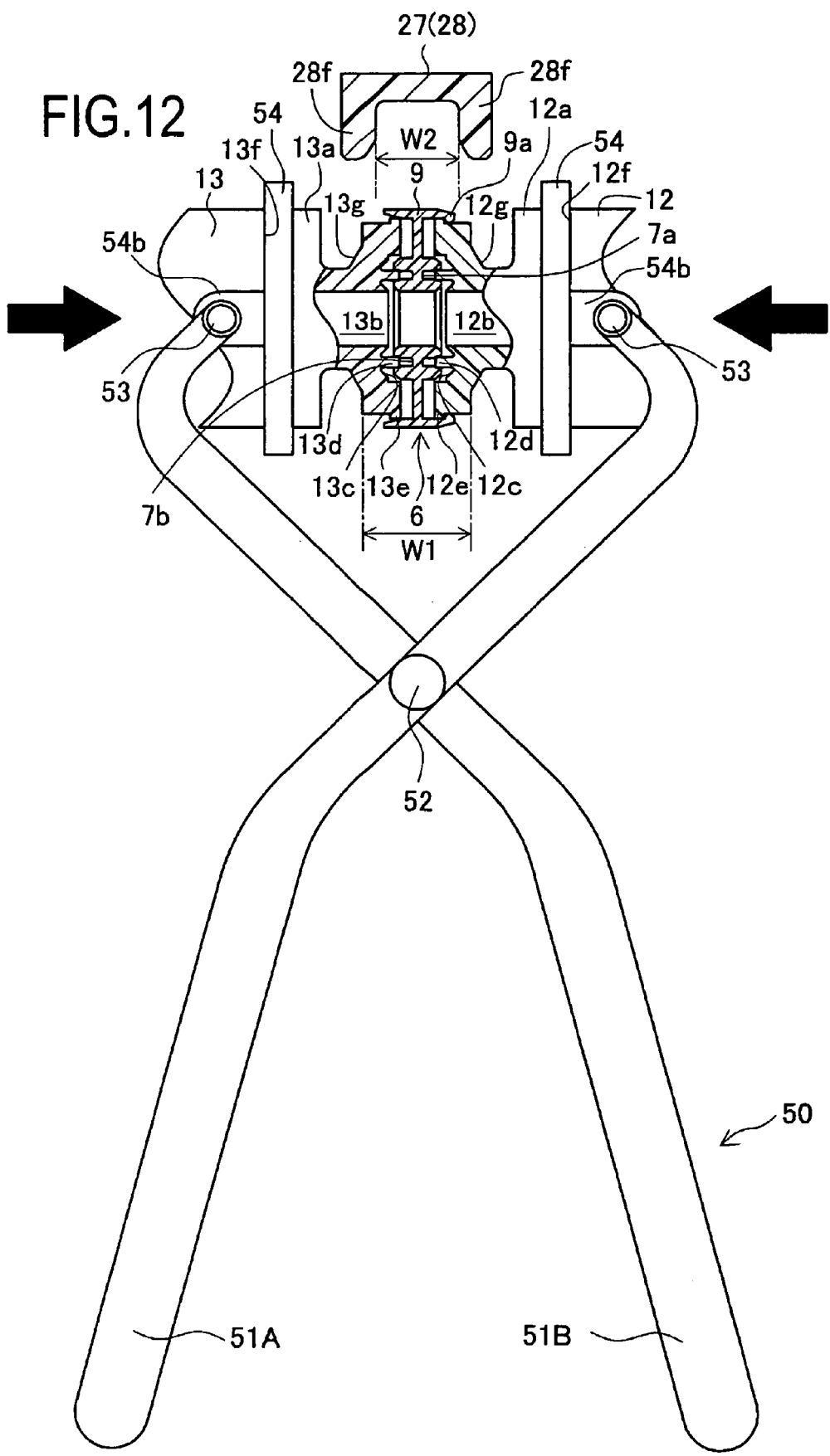
FIG. 12 is a view showing a state before the first and the second connection parts are drawn or clamped to each other by the jig shown in FIG. 11.

As shown in FIG. 12, for coupling the connection parts 12a and 13a, the hook portions 9a of the seal member 6 are hooked on the annular flange 12e of the connection part 12a. Accordingly, in the seal member 6, the annular groove 7a is aligned with the annular protrusion 12d of the connection part 12a. In the first flow rate control valve 13, the connection part 13a is inserted in the holding portions 9 of the seal member 6 which is temporarily mounted in the connection part 12a, and the leading end of the annular protrusion 13d is slightly inserted in the annular groove 7b.

At this stage, a distance W1 between the attaching grooves 12g and 13g of the connection parts 12a and 13a is wider than a distance W2 between the projections 28f of the coupling member 27. Thus, the coupling member 27 is not allowed to be attached to the connection parts 12a and 13a. Accordingly, the pressurizing plates 54 of the holding jig 50 are mounted in the mounting grooves 12f and 13f of the connection parts 12a and 13a, and the handles 51A and 51B of the holding jig 50 are tightly grasped to bring the connection parts 12a and 13a closer to each other.

Figure 13:
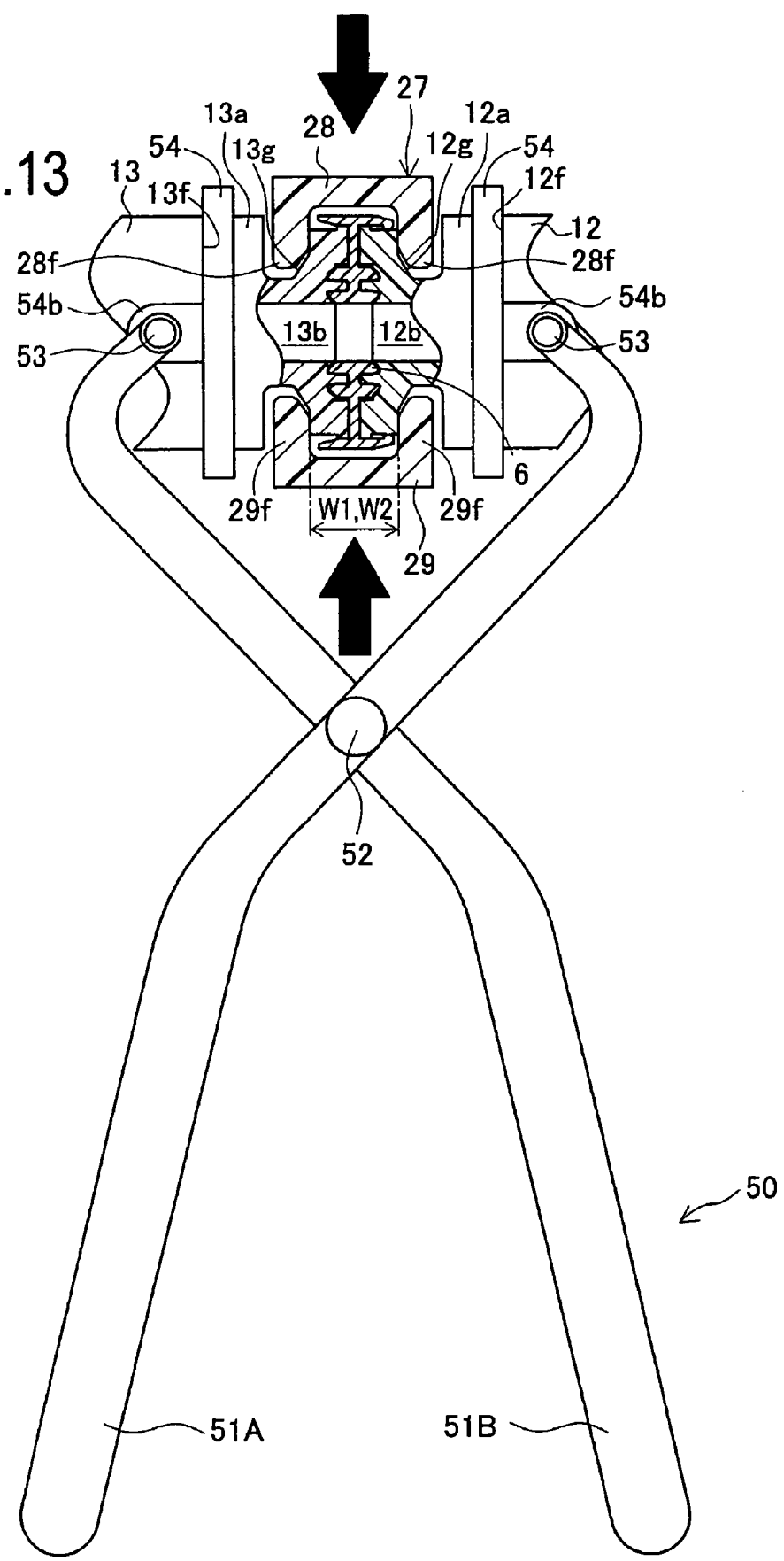
FIG. 13 is a view showing a state after the first and the second connection parts are drawn or clamped to each other by the jig shown in FIG. 11.

As a result, in FIG. 13, the annular protrusions 12d and 13d are press-fitted in the press-fit allowances 7c and 7d provided in the annular grooves 7a and 7b of the seal member 6. When the distance W1 between the attaching grooves 12g and 13g becomes narrower than the distance W2 between the projections 28f and 29f of the coupling member 27, the projections 28f and 29f of the first and second divided parts 28 and 29 are inserted in the attaching grooves 12g and 13g so that the coupling member 27 is arranged to surround the connection parts 12a and 13a. In the coupling member 27, the first and second divided parts 28 and 29 are coupled by the engagement of the first and second engagement protrusions 28d and 29d and the second and first engagement recesses 29e and 28e and by the engagement of the locking portion 28c and the extended portion 29a. In this manner, the connection parts 12a and 13a are finally connected. Furthermore, the coupling member 27 is preferably attached with the fixing pin 30 in advance in the extended portions 28a and 29a for supplementary tightening.

The holding jig 50 is detached from the mounting grooves 12f and 13f, and the support member 34 is disposed between the connection parts 12a and 13a and the supporting frame 33 of the support assembly 31. The support member 34 is fitted on the supporting frame 33 by deforming the flexible parts 41b so that the supporting frame 33 is pushed into the clamp portion 41a. Subsequently, the connection parts 12a and 13a are placed on the extended portions 41c of the support member 34. Then, the coupling portion 42 is turned about the engaged portion of the fitting piece 42b fitted in the fitting recess 41g of the main body 41, and the engagement hook 42a is inserted into the insertion hole 41f of the main body 41 into engagement with the first engagement portion 41d.

Further, the protrusion 42c of the coupling portion 42 is firmly fitted in the mounting groove 13f of the connection part 13a so that the coupling portion 42 presses the connection part 13a against the extended portion 41c to fix the connection part 13a to the support member 34. Similarly, the connection part 12a is also fixed to the support member 34. In this way, the connecting portion between the connection parts 12a and 13a is supported by the supporting frame 33 via the support member 34, thereby the first flow rate control valve 13 and the first flow meter 12 are mounted in the support assembly 31.

In the support assembly 31, the frames (the holding frames 32 and the supporting frames 33) are assembled in a lattice shape. Accordingly, for the attachment and removal operation of the above fluid devices, an operator is allowed to insert his hands into the spaces between the holding frames 32 and the supporting frames 33. Hence, even if the first and second air-operated valves 11 and 12 and the first and second flow rate control valves 13 and 23 are disposed opposite the first and second flow meters 12 and 22 in order to reduce the disposing space, it is easy for the operator to attach or remove the first flow rate control valve 13 to or from the first flow meter 12.

Moreover, if the support assembly 31 becomes unstable during the attachment and removal operation of the above fluid devices, it is preferable to adjust the overall length of the holding frames 32 by rotating the caps 39 so that the holding frames 32 are firmly retained in the space.

<Additional Fluid Devices>

Figure 15:
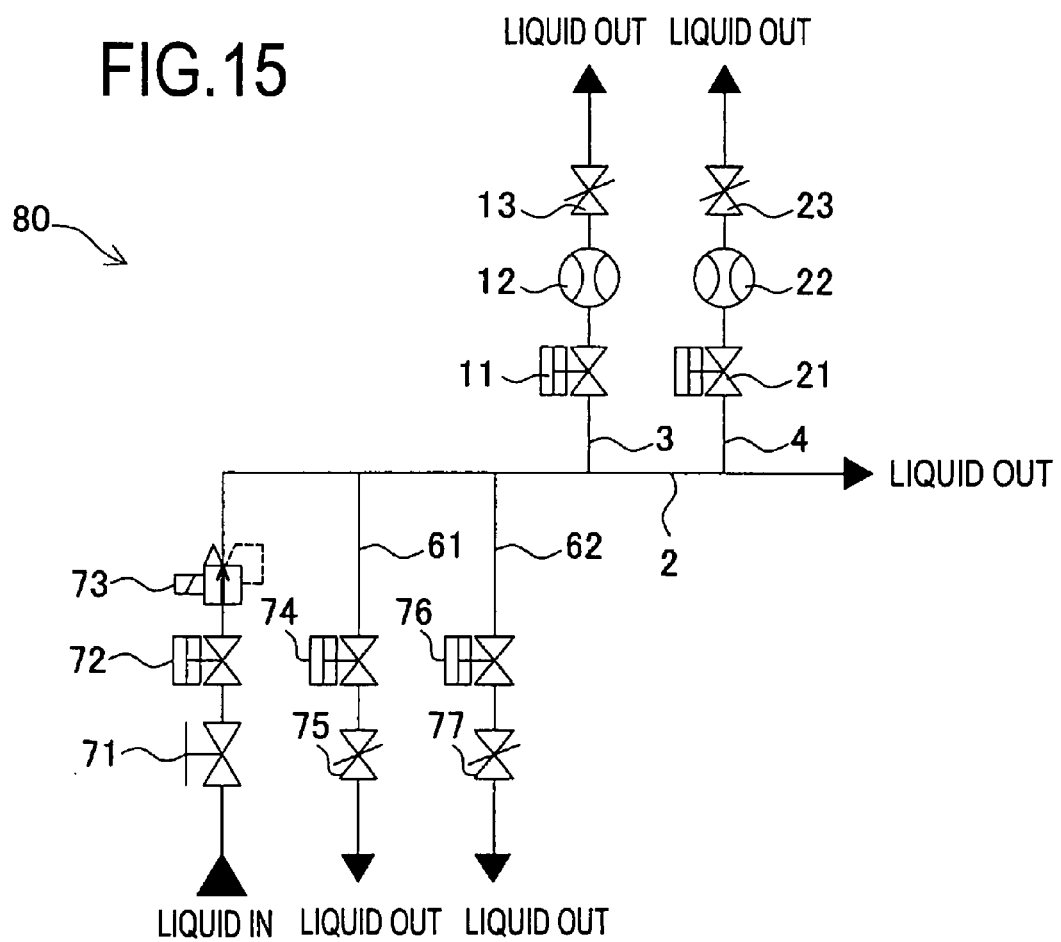
FIG. 15 is a modified circuit diagram of the fluid device unit shown in FIG. 1.

Addition of fluid devices is now explained using a case that mounts additional fluid devices in the fluid device unit 1 in FIG. 14 to configure a fluid device unit 80 shown in FIG. 15.

In the fluid device unit 80 shown in FIG. 15, a manual valve 71, an air-operated valve 72, and a regulator 73 are disposed on the main passage 2 for pressure adjustment. The main passage 2 is connected to, besides the first and second sub-passages 3 and 4, third and forth sub-passages 61 and 62 to distribute a chemical liquid. In the third and forth sub-passages 61 and 62, third and forth air-operated valves 74 and 76 and third and forth flow rate control valves 75 and 77 are respectively provided.

Figure 16:
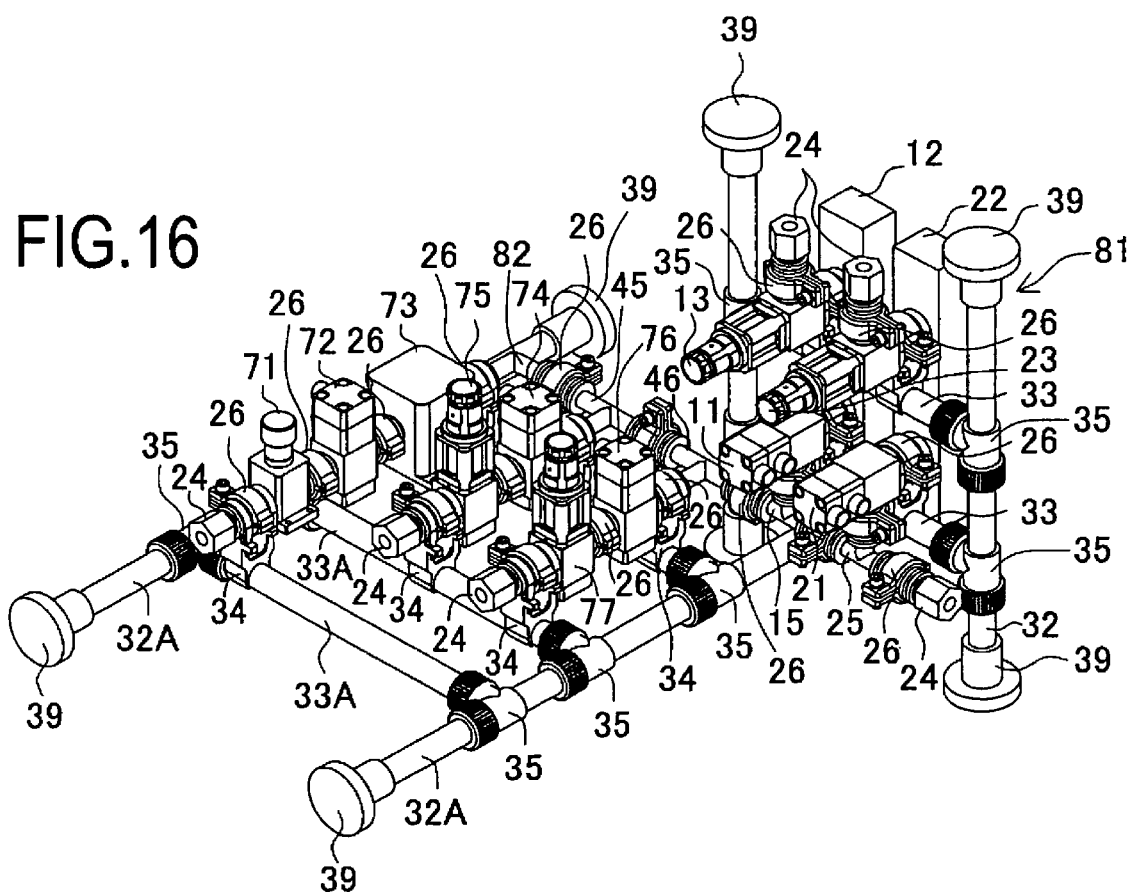
FIG. 16 is an external perspective view showing a fluid device mounting structure in which fluid devices shown in FIG. 15 are attached on a support assembly.
Figure 17:
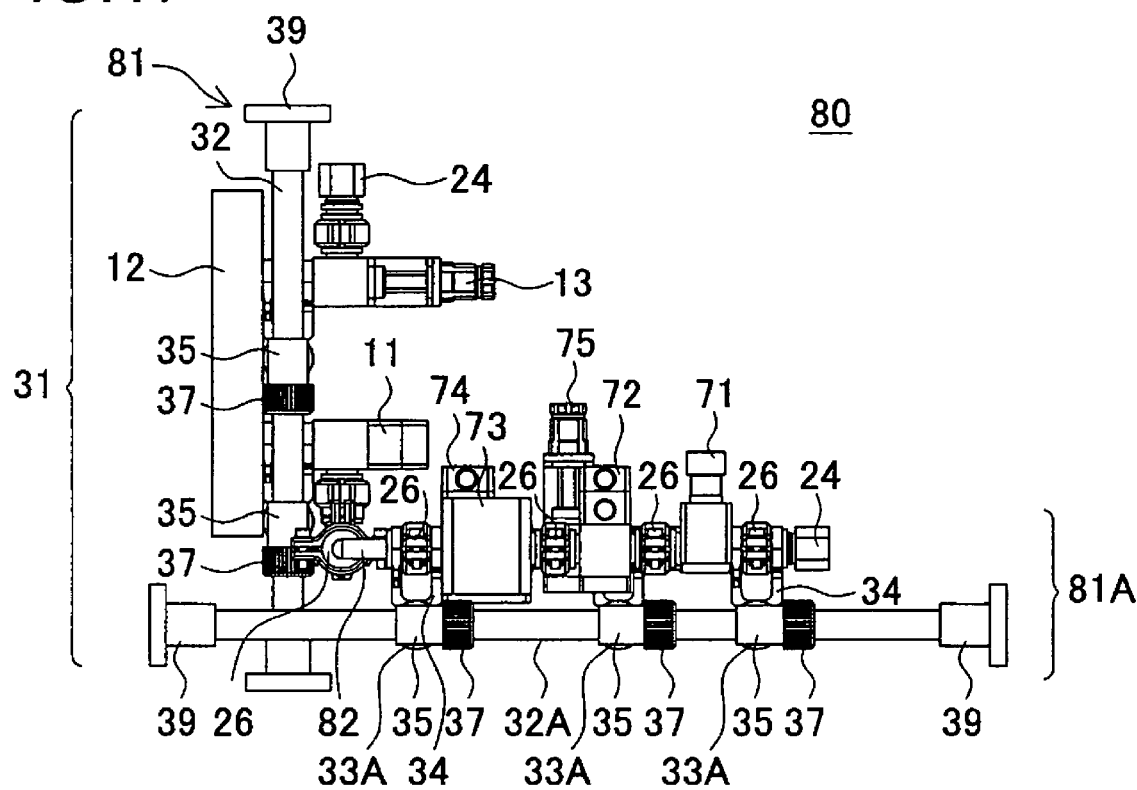
FIG. 17 is a side view of the fluid device mounting structure shown in FIG. 16.
Figure 22:
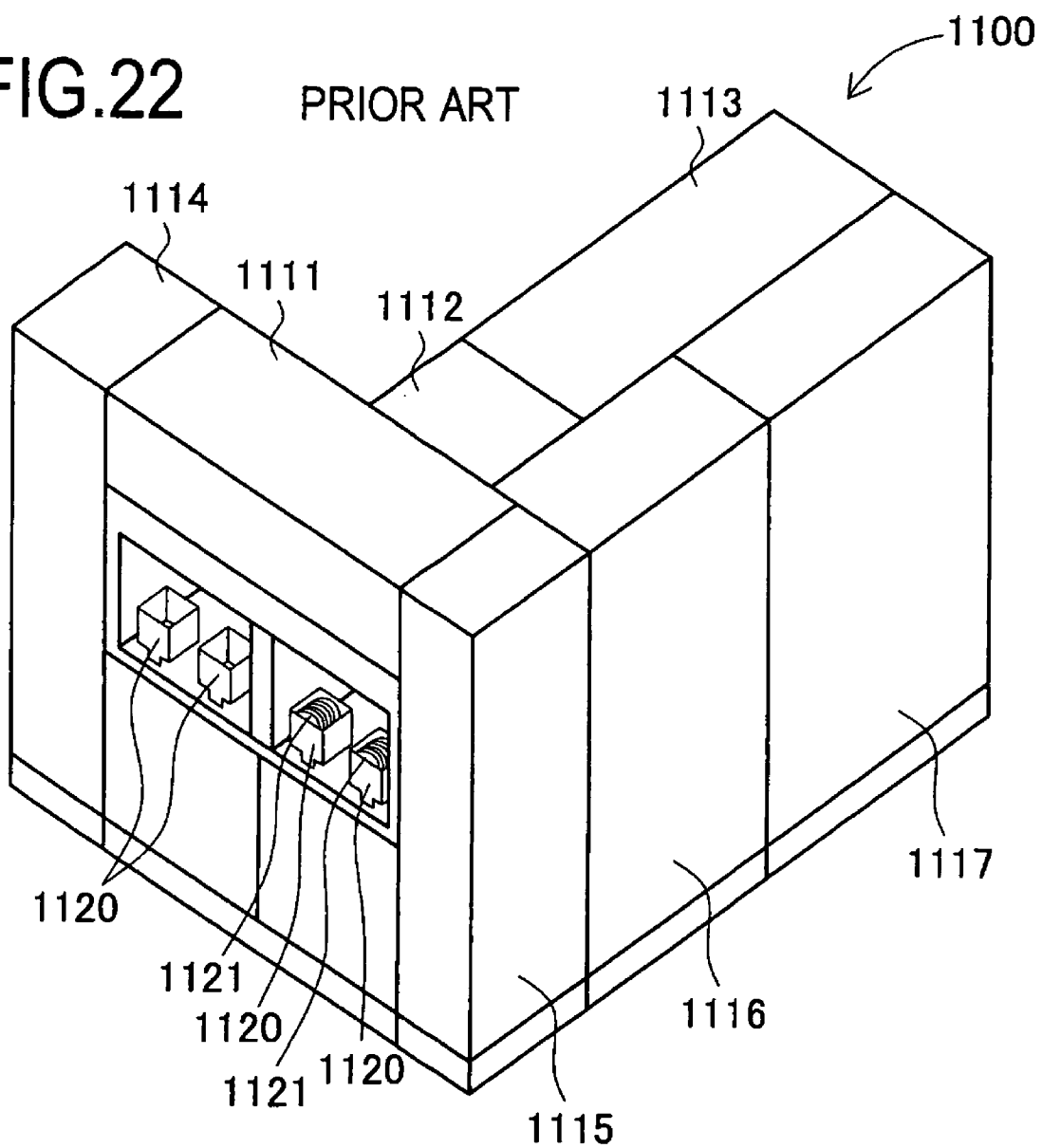
FIG. 22 is an external perspective view of a cleaning system.
Figure 23:
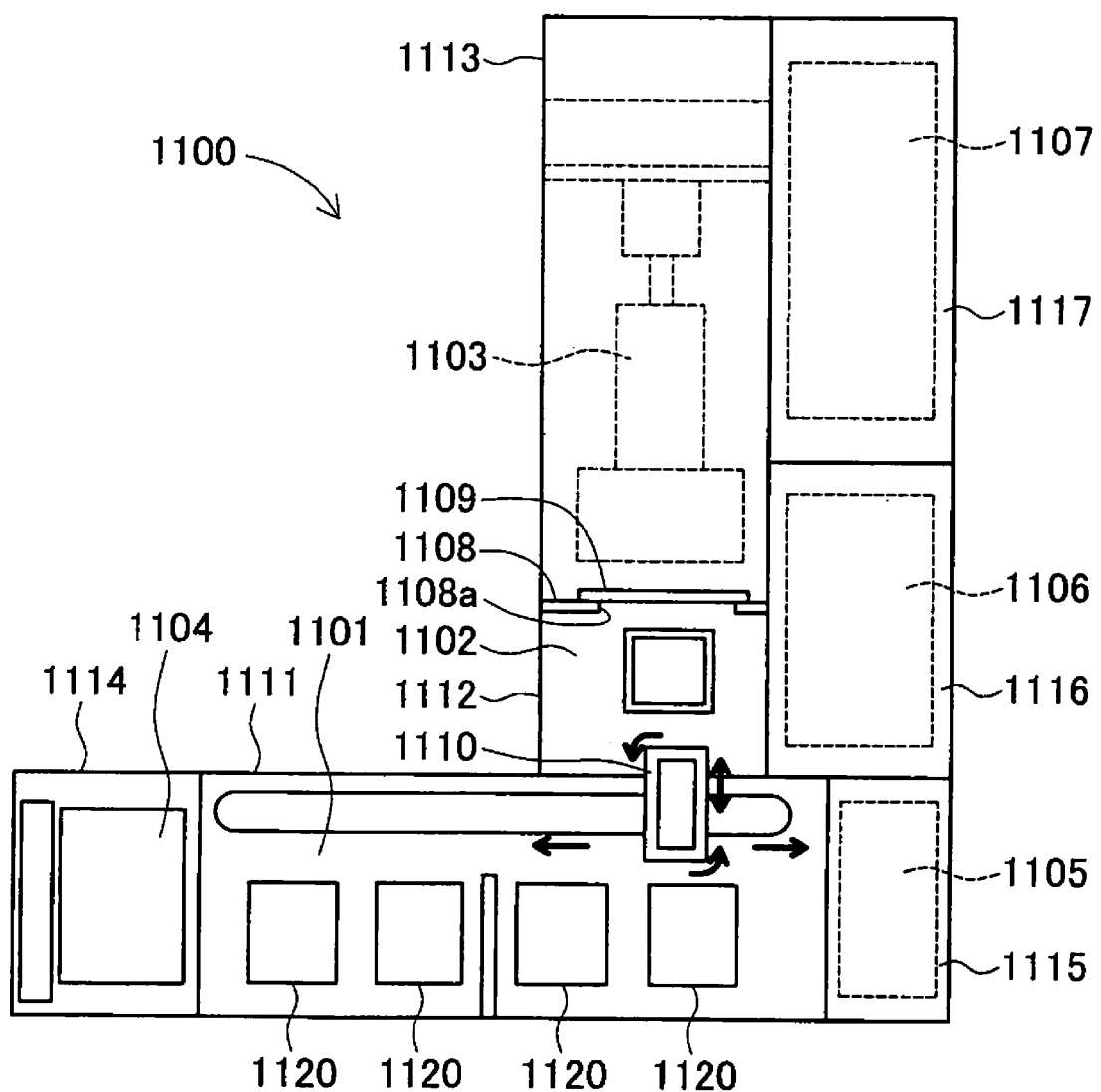
FIG. 23 is a plan view of the cleaning system shown in FIG. 22.

For example, if the space between the cleaning unit 1103 and the third casing 1113 (see FIGS. 22 and 23) is L-shaped, a L-shaped support assembly 81 is configured as shown in FIGS. 16 and 17. The support assembly 81 includes a first assembly of a pair of the holding frames 32 and the two supporting frames 33, this first assembly being disposed in the vertical position and a second assembly of two holding frames 32A longer than the holding frame 32 and three supporting frames 33A longer than the supporting frame 33 and arranged between the holding frames 32A, this second assembly being disposed in the horizontal position. The supporting frames 33 and 33A are respectively fixed in optional positions on the holding frames 32 and 32A by the positioning members 35.

In the first assembly disposed vertically, similar to the support assembly 31 as explained above, each connecting portion of the fluid devices 11 to 13, 15, and 21 to 25 is attached to the supporting frames 33 via the support members 34. On the other hand, in the second assembly disposed horizontally, additional fluid devices are mounted on the supporting frames 33A.

The manual valve 71, the air-operated valve 72, the regulator 73, the L-shaped pipe 82, the branch pipes 45, 46, 15, and 25, and the joint block 24 are coupled to each other in respective connecting portions by the sealing structure 26 to form the main passage 2 (see FIG. 15). On the branch pipes 45 and 46, the third and forth air-operated valves 74 and 76 and the third and forth flow rate control valves 75 and 77 are mutually connected in respective connecting portions by the sealing structure 26 to form the third and forth sub-passages 61 and 62 (see FIG. 15).

In the support assembly 81, the connecting portions of the joint block 24 and the manual valve 71 are supported by the supporting frame 33A via the support member 34. The connecting portions of the joint blocks 24 and the third and forth flow rate control valves 75 and 77 are supported by another supporting frame 33A via the support members 34. Moreover, the connecting portions of the regulator 77 and the L-shaped pipe 82 and the connecting portions of the third and forth air-operated valves 74 and 76 and the branch pipes 45 and 46 are supported by other supporting frames 33A via the support members 34.

In the meantime, as shown in FIG. 17, the manual valve 71, the air-operated valve 72, and the regulator 73 are different in port heights (positions in the vertical direction) and mounting dimensions. Hence, when these devices are mounted on a bracket as disclosed in prior arts, a specialized bracket is needed to adjust the port heights of the manual valve 71 and the air-operated valve 72 to that of the regulator 73 located in a higher position.

However, in the support assembly 81, the connecting portions of the joint block 24 and the manual valve 71, the connecting portions of the manual valve 71 and the air-operated valve 72, and the connecting portions of the regulator 73 and the L-shaped pipe 82 are all supported by the supporting frames 33A by way of the support members 34. Furthermore, there is space created between the holding frames 32A and the supporting frames 33A, so that the heights and sizes of the fluid devices are not limited. Therefore, the regulator 73, the air-operated valve 72, the manual valve 71, and the joint block 24 are not disposed on the bracket with reference to bottom surfaces thereof but are mounted on the supporting frames 33A of the support assembly 81 with reference to each connecting portion. Consequently, the regulator 73, the air-operated valve 72, and the manual valve 71 can be mounted on the supporting frames 33A which support the connecting portions of the third and forth air-operated valves 74 and 76 and the third and forth flow rate control valves 75 and 77 having the same port heights and same mounting heights.

<Modification of Support Assembly>

Figure 18:
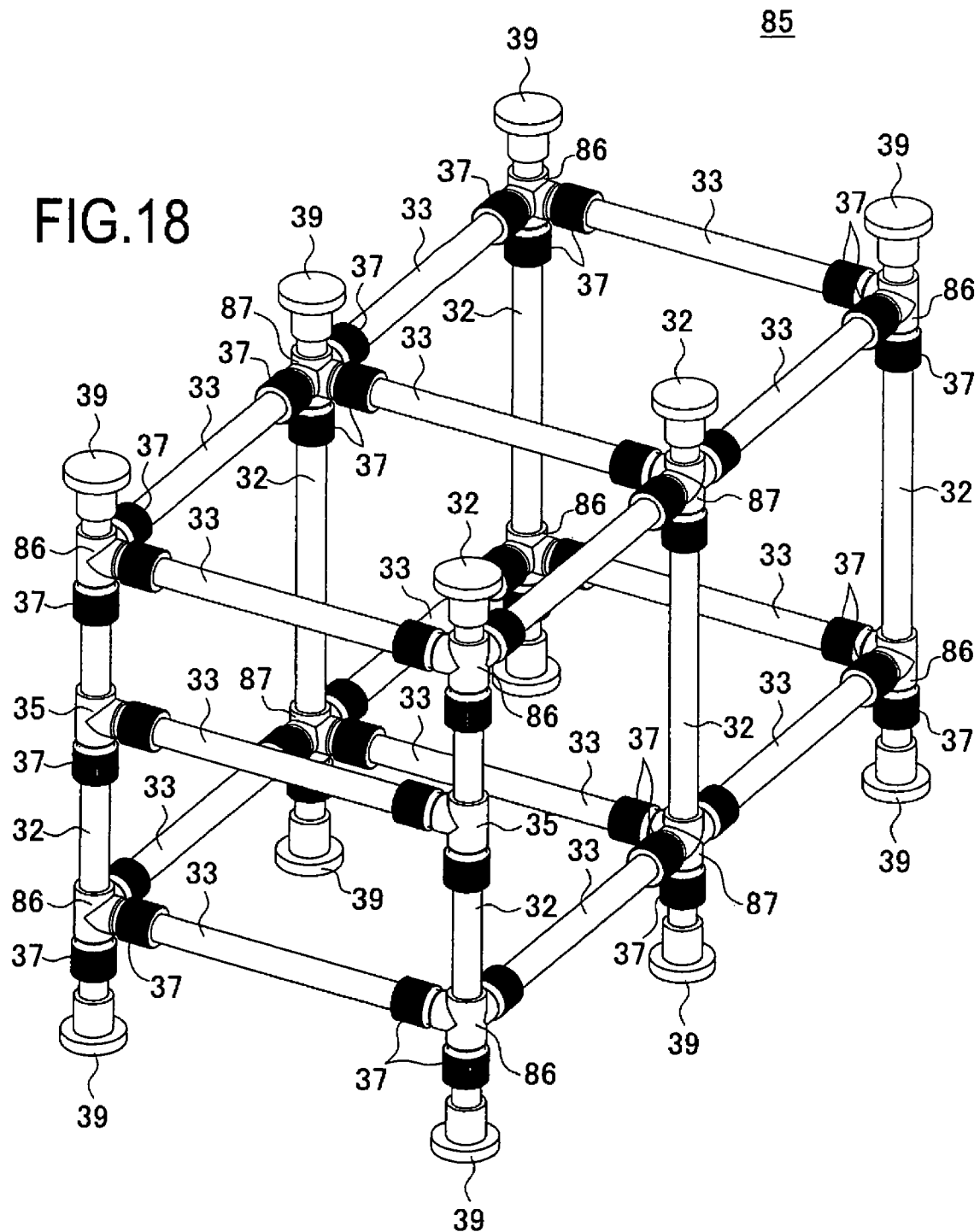
FIG. 18 is a modification of the support assembly shown in FIG. 2.

As shown in an external perspective view of FIG. 18, a support assembly 85 is configured such that the holding frames 32 and the supporting frames 33 are assembled in a lattice shape by use of positioning members 35, 86, and 87, each having different shapes. Each positioning member 86 is joined to two supporting frames 33 and each positioning member 87 is joined to three supporting frames 33. The joining mechanism of the positioning members 86 and 87 to the supporting members 33 is same as the positioning member 35 shown in FIGS. 3 and 4, so the explanation thereof is omitted.

In the fluid device mounting structure 5 using the common holding frames 32, the common supporting frames 33, and the common positioning members 35, 86, and 87, the two-dimensional support assembly 31 and the three-dimensional support assembly 85 can be assembled in an arbitrary shape. Therefore, the support assemblies 31 and 85 can be configured appropriately to meet the open space and the layout of the fluid devices. Thus, it is unnecessary to design a specialized support assembly.

<Operations and Effects>

In the fluid device mounting structure 5 of the first embodiment, a plurality of frames (two holding frames 32 and two supporting frames 33) are assembled in a lattice shape to constitute the support assembly 31 so that the connecting portions of the fluid devices 11 to 13, 15, and 21 to 25 are supported by the supporting frames 33 to mount the plurality of the fluid devices 11 to 13, 15, and 21 to 25 in the support assembly 31. Specifically, for example, it is possible to arrange the first and second flow meters 12 and 22 opposite the first and second air-operated valves 11 and 21 and the first and second flow rate control valves 13 and 23 held by the support assembly 31 therebetween. Alternatively, it is possible to arrange the branch pipes 15 and 25, the first and second air-operated valves 11 and 21, and the first and second flow rate control valves 13 and 23 in the vertical direction. As a consequence, the fluid device mounting structure 5 of the first embodiment allows three-dimensional free arrangement of the fluid devices 11 to 13, 15, and 21 to 25, thereby reducing the installation space for the fluid devices 11 to 13, 15, and 21 to 25. Specifically, in the fluid device mounting structure 5 of the first embodiment, the installation space for the fluid devices can be reduced to almost half compared to the conventional structure where the fluid devices 11 to 13, 15, and 21 to 25 are arranged two-dimensionally on a bracket.

Owing to such the configuration, as exemplified in the fluid device unit 80 of FIG. 17, even if the manual valve 71, the air-operated valve 72, and the regulator 73 are different in port heights and mounting dimensions, the connecting portions of the joint blocks 24, the manual valve 71, the air-operated valve 72, and the regulator 73 can be supported by the supporting frames 33A to install the joint blocks 24, the manual valve 71, and the regulator 73 in the support assembly 81, omitting the designing man-hours for a specialized support assembly.

Moreover, even in the case where an intended place for the fluid devices 11 to 13, 15, and 21 to 25 does not have enough space for installing all the fluid devices 11 to 13, 15, and 21 to 25 in the same plane, for example, if there is a L-shaped space, the holding frames 32 and the supporting frames 33 are assembled to constitute the L-shaped support assembly 81 so as to be placed in the L-shaped open space (see FIGS. 16 and 17). Then, the connecting portions of the fluid devices 11 to 13, 15, and 21 to 25 are supported by the supporting frames 33 respectively, so that all the fluid devices 11 to 13, 15, and 21 to 25 can be housed in the open space.

In another case that there are numerous fluid devices creating rectangular parallelepiped spaces, as shown in FIG. 18, for example, the holding frames 32 and the supporting frames 33 are assembled to constitute the rectangular parallelepiped support assembly 85 so that the supporting frames 33 support the connecting portions of the fluid devices via the support members 34. Since the holding frames 32, the supporting frames 33, the positioning members 35, 86, and 87, and the support members 34 are standardized in this manner, it is possible to configure the support assemblies 35, 81, and 85 in optional shapes two-dimensionally or three-dimensionally, reducing the designing man-hours for the support assembly. Furthermore, modification of the support bodies 31, 81, 85 in accordance with the addition of fluid devices can be made easily.

In the fluid device mounting structure 5 of the first embodiment, the positioning members 35 are mounted on opposite ends of each supporting frame 33, and thus the supporting frame 33 is positioned and fixed with respect to the holding frame 32. Consequently, the position of each supporting frame 33 can be easily adjusted to meet the arrangement or layout of the fluid devices, so that the fluid devices 11 to 13, 15, and 21 to 25 are efficiently mounted on the support assembly 31.

In the fluid device mounting structure 5 of the first embodiment, for example, the first flow meter 12 includes the connection part 12a provided with the mounting groove 12f on the outer peripheral surface thereof and similarly, the first flow rate control valve 13 includes the connection part 13a in identical shape with the connection part 12a, provided with the mounting groove 13f on the outer peripheral surface thereof. The fluid device mounting structure 5 is further formed with the support member 34 coupled with the mounting grooves 12f and 13f of the connection parts 12a and 13a in a removable manner, holding the supporting frames 33 to support the connecting portion between the connection parts 12a and 13a. In the thus configured fluid device mounting structure 5 of the first embodiment, the connecting portion between the connection part 12a of the first flow meter 12 and the connection part 13a of the first flow rate control valve 13 can be easily attached to and removed from the supporting frame 33 by way of the support member 34.

In the fluid device mounting structure 5 of the first embodiment, while the body 41 of the support member 34 is coupled with the supporting frame 33, for example, the protrusion 42c is fitted in the mounting grooves 12f and 13f to engage the coupling portion 42 with the connection parts 12a and 13a, so that the connection parts 12a and 13a are supported by the supporting frame 33. On the contrary, once the coupling portion 42 is disengaged from the body 41, the connection parts 12a and 13a are not supported by the supporting frame 33. Therefore, according to the fluid device mounting structure 5 of the first embodiment, the connection parts 12a and 13a can be easily attached to and removed from the supporting frame 33 by way of the coupling portion 42.

Further, in the fluid device mounting structure 5 of the first embodiment, the support member 34 is mounted on the supporting frame 33 in a removable manner, so that the support member 34 can be easily disposed corresponding to the arrangement of the fluid devices.

Furthermore, in the fluid device mounting structure 5 of the first embodiment, the support member 34 is coupled with the connecting portions of the fluid devices by way of the mounting grooves 12f and 13f to which the holding jig 50 is attached for drawing closer and clamping the fluid devices, thus omitting further processes for coupling the support member 34.

Second Embodiment

Figure 19:
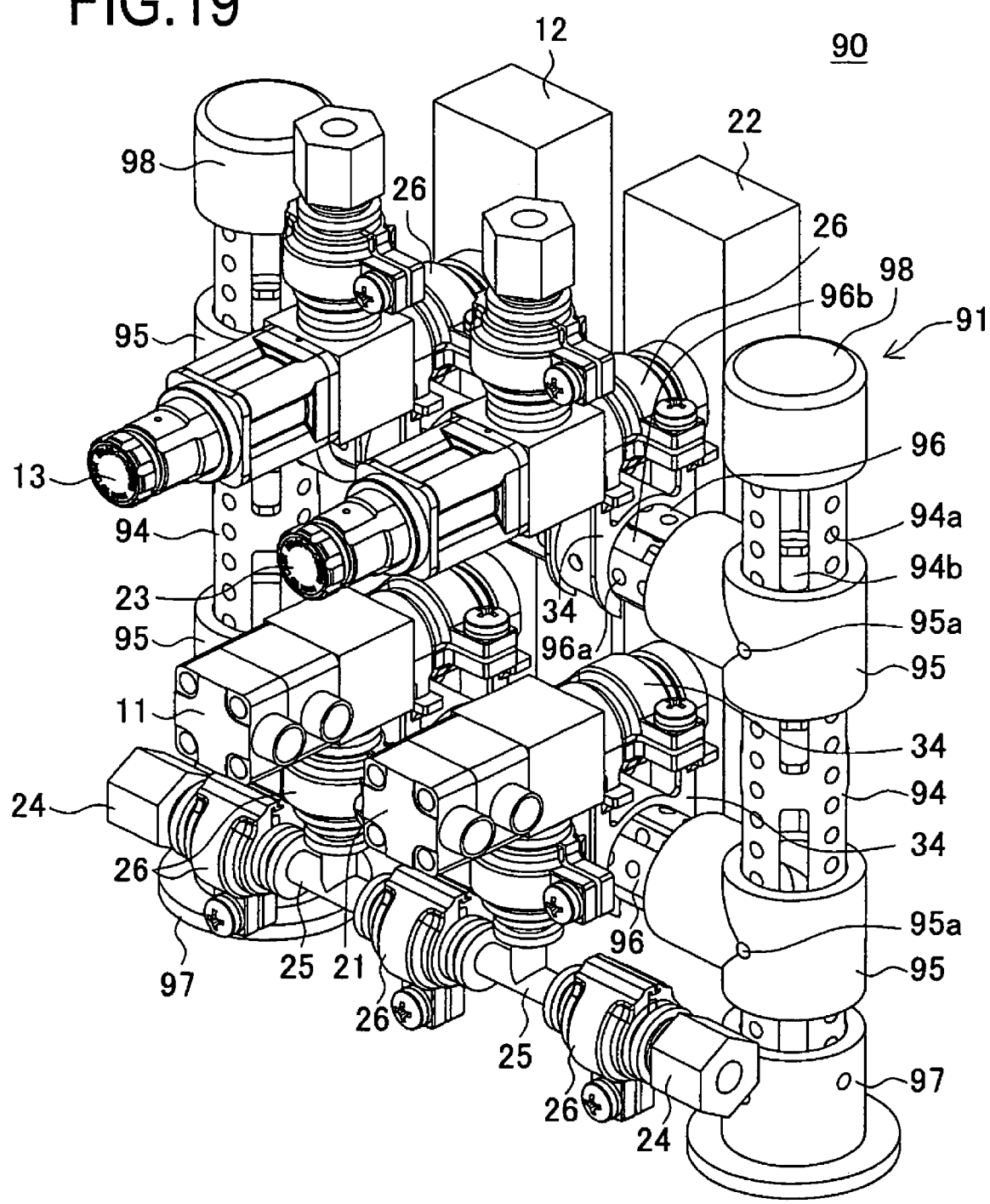
FIG. 19 is an external perspective view of a fluid device mounting structure in a second embodiment of the present invention.

A detailed description of a second embodiment of a fluid device mounting structure embodying the present invention will now be given referring to the accompanying drawings. FIG. 19 is an external perspective view of a fluid device mounting structure 90 according to the second embodiment.

The fluid device mounting structure 90 of the second embodiment is different from that of the first embodiment as for shapes of a holding frame 94 and a supporting frame 96, and other parts or components are same as those of the first embodiment. Therefore, the following explanation is focused on different parts or components from the first embodiment, and same configurations as those of the first embodiment are designated by the same reference signs and their descriptions are omitted.

In the fluid device mounting structure 90, the holding frames 94 and the supporting frames 96 are assembled in a lattice shape to constitute a support assembly 91. Each holding frame 94 and each supporting frame 96 are of pipe-like shapes having hollow portions. Each holding frame 94 and each supporting frame 96 are made from pipes with desired length and formed with housing holes 94b and 96b respectively, each having a predetermined length in the axial direction, and through holes 94a and 96a of circular shape. A positioning member 95 is formed with an insertion hole for inserting a fixing pin 95a. When this insertion hole is aligned with one of the through holes 94a of the holding frame 94 and the fixing pin 95a is inserted through the insertion hole and the through hole 94a, the positioning member 95 is fixed in place to the holding frame 94. In addition, at opposite ends of each holding frame 94, caps 97 and 98 are fixed with pins or the like inserted in the through holes 94a.

Further, in the fluid device mounting structure 90, at least either wires of the first and second flow meters 12 and 22 or pipes connected to operation ports of the first and second air-operated valves 11 and 21 is brought and housed in hollow spaces of the holding frame 94 and the supporting frame 96 through the housing holes 94b and 96b.

Consequently, in the fluid device mounting structure 90 of the second embodiment, the wires of the first and second flow meters 12 and 22 and the pipes connected to the first and second air-operated valves 11 and 21 can be collectively housed inside the holding frame 94 and the supporting frame 96, so that the wires and the pipes do not become obstructive in attachment and removal of the fluid devices with respect to the support assembly 91. Therefore, the fluid devices can be easily attached to and removed from the support assembly 91.

Third Embodiment

Figure 20:
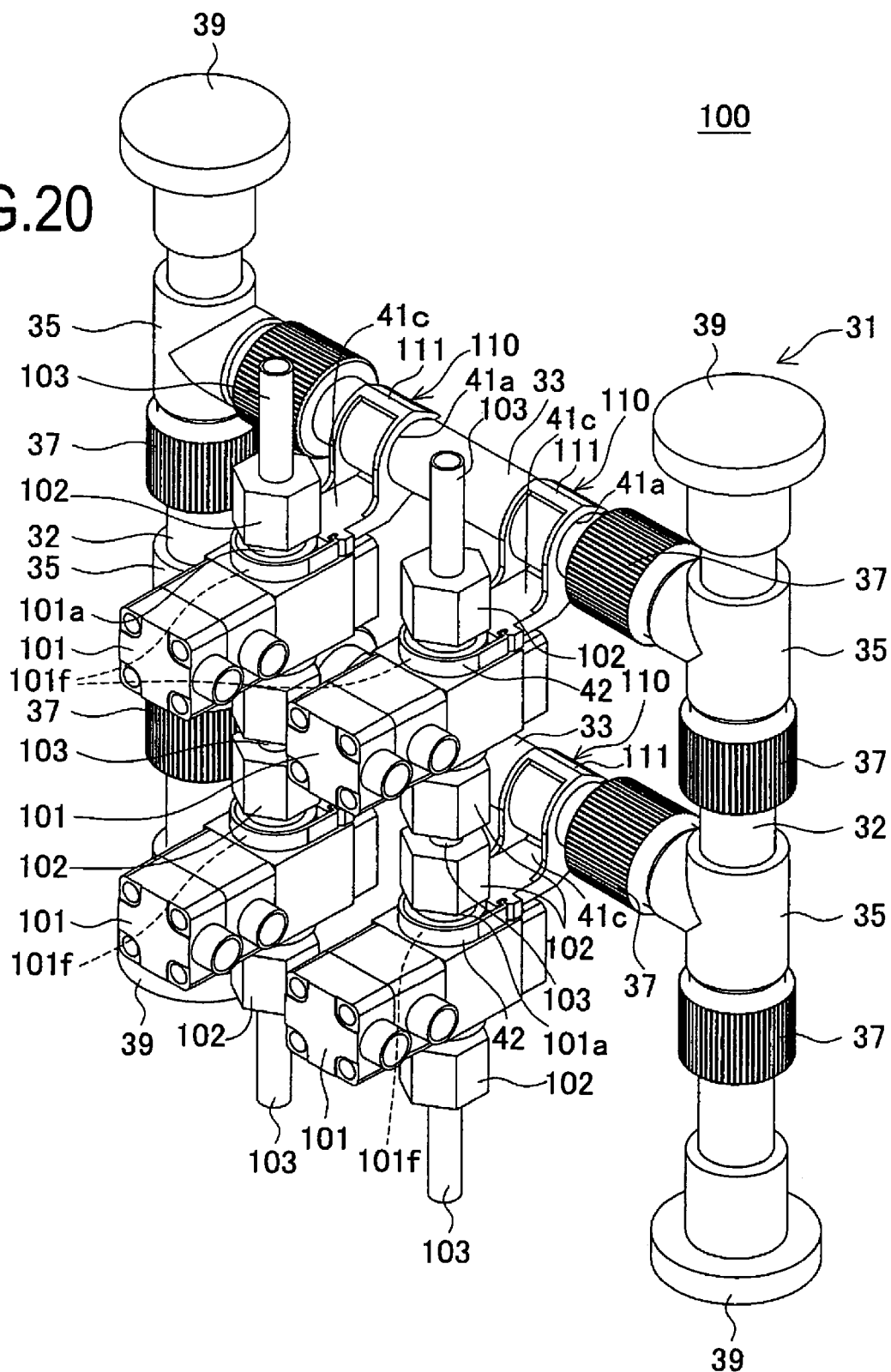
FIG. 20 is an external perspective view of a fluid device mounting structure in a third embodiment of the present invention.
Figure 21:
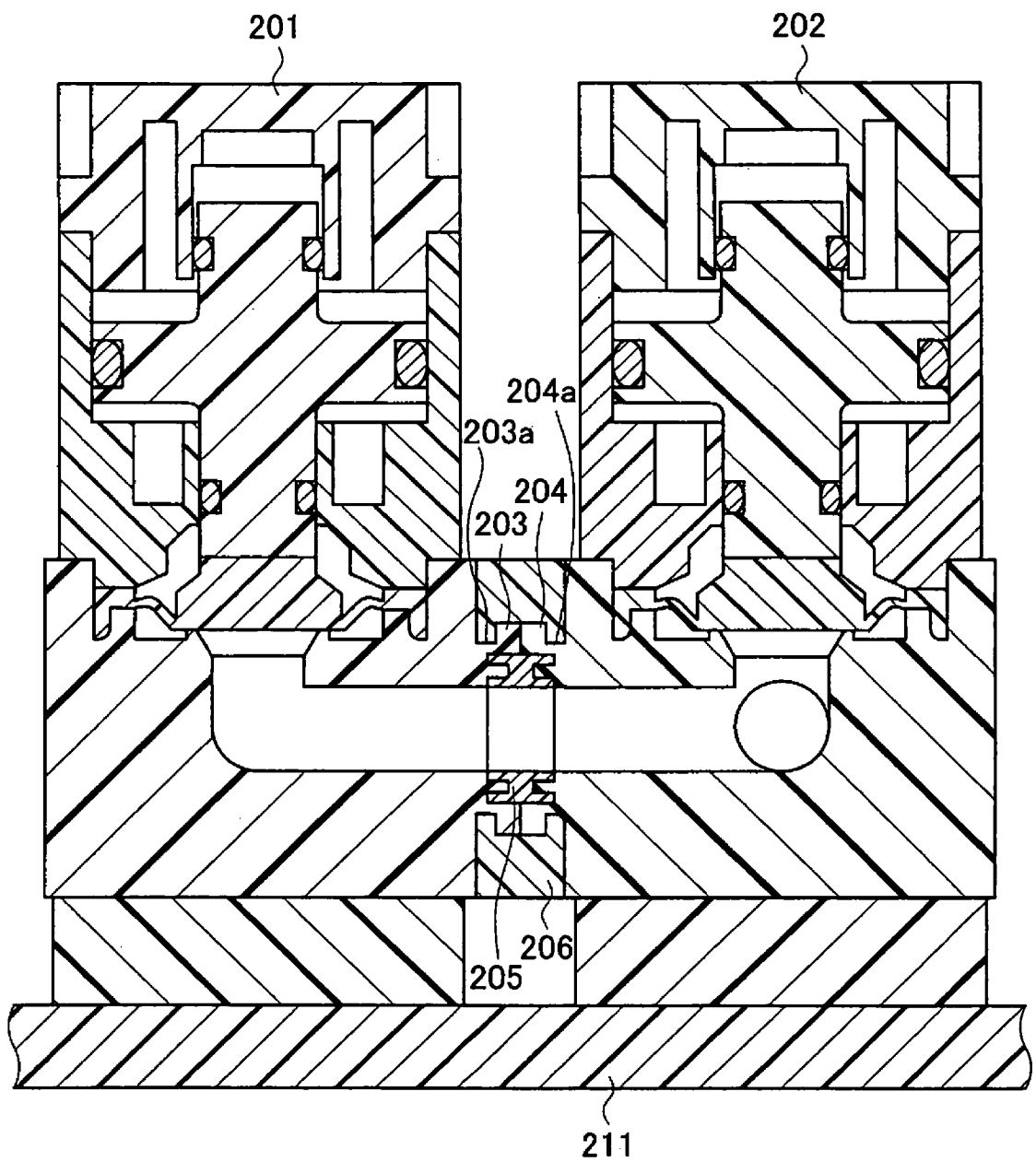
FIG. 21 is a sectional view of a conventional fluid device mounting structure.

A detailed description of a third embodiment of a fluid device mounting structure embodying the present invention will now be given referring to the accompanying drawings. FIG. 20 is an external perspective view of a fluid device mounting structure 100 according to the third embodiment.

In the fluid device mounting structure 100, fluid devices are connected via piping tubes 103, and a configuration of a support member 110 is different from the first embodiment. Therefore, the following explanation is focused on parts or components different from the first embodiment, and same configurations as those of the first embodiment are designated by the same reference signs and their descriptions are omitted.

In the fluid device mounting structure 100, air-operated valves 101 as one example of a "fluid device" are connected by resin-made piping tubes 103 to configure a fluid device unit. Each piping tube 103 is attached to a connection part 101a of the air-operated valve 101 via a joint 102. On an outer peripheral surface of the connection part 101a, a mounting groove 101f is formed as similar to the mounting groove 13f of the first embodiment.

The support member 110 includes a single extended portion 41c formed in a body 111 having a clamp portion 41a, and a coupling portion 42 is engaged with the extended portion 41c. The engagement structure of the clamp portion 41a and the coupling portion 42 is same as the first embodiment, hence the explanation thereof is omitted.

In thus configured fluid device mounting structure 100, the support member 110 includes the extended portion 41c disposed along one side surface (an upper side surface in FIG. 20) of the air-operated valve 101 and the coupling portion 42 is fitted in the mounting groove 101f of the connection part 101a so that the air-operated valve 101 is mounted on the supporting frame 33. The support member 110 is fixed on the supporting frame 33 by the clamp portion 41a grasping the frame 33, thereby supporting the connecting portions of the air-operated valve 101 and the piping tube 103 in a cantilevered manner.

Consequently, in the fluid device mounting structure 100, the air-operated valve 101 includes the connection part 101a formed with the mounting groove 101f on the outer peripheral surface, and the piping tube 103 is attached to the connection part 101a in a removable manner. In the fluid device mounting structure 100, the support member 110 is fitted in the mounting groove 101f, and the connecting portions of the connection part 101a and the piping tube 103 are supported by the supporting frame 33 through the support member 110. In the thus configured fluid device mounting structure 100 of the third embodiment, the connection part 101a of the air-operated valve 101 and the piping tube 103 can be easily attached to and removed from the supporting frame 33 by use of the support member 110.

Moreover, in the fluid device mounting structure 100 of the third embodiment, the extended portion 41c of the support member 110 is disposed along the side surface of the air-operated valve 101, thereby the connecting portions of the connection part 101a and the piping tube 103 are supported in a cantilevered manner. As a result, even if each fluid device has different height and mounting dimension, each connecting portion can be supported by the support member 110. Therefore, according to the fluid device mounting structure 100 of the third embodiment, the common support members 110 can be used irrespective of types of fluid devices.

The present invention may be embodied in other specific forms without departing from the essential characteristics thereof.

(1) For example, in the above mentioned embodiments, a recess may be provided on an outer peripheral surface of a holding frame in the axial direction, and a protrusion may be provided on an inner periphery of a component which connects a supporting frame with the holding frame, thereby the protrusion is fitted in the recess so that the height of the supporting frame can be adjusted to that of the holding frame. Alternatively, a protrusion may be formed on the outer peripheral surface of the holding frame in the axial direction, and a recess may be formed on the inner peripheral surface of the component which supports the supporting frame with the holding frame, thereby the protrusion is fitted in the recess so that the height of the supporting frame is adjusted.

(2) For example, a support member may have a seat surface which contacts with a bottom surface of a fluid device so that the single fluid device can be attached to a support assembly. On both sides of the seat surface, the extended portions 41c may be formed in a standing manner to form the coupling portion 42 thereon.

(3) In the above mentioned embodiments, the support member 34 is attached to the supporting frame 33 in a removable manner. Alternatively, the support member 34 and the supporting frame 33 may be integrally formed.

(4) In the above embodiments, the supporting frame 33 and the holding frame 32 are made from resin-made pipes. Alternatively, the supporting frame 33 and the holding frame 32 may be made from materials such as bar material and rectangular material.

(5) In the above embodiments, the engagement hook 42a is inserted in the insertion hole 41f of the body 41 to be engaged with the bodies 41 and 111. Alternatively, the coupling portion 42 may be engaged with the bodies 41 and 111 by use of pins and others. Further, in the above embodiments, the fitting piece 42b is fitted in the fitting recess 41g to hold the coupling portion 42 with the body 41 in a rotatable manner. Alternatively, the coupling portion 42 may be held with the bodies 41 and 111 by a hinge.

While the presently preferred embodiments of the present invention have been shown and described, it is to be understood that this disclosure is for the purpose of illustration and that various changes and modifications may be made without departing from the scope of the invention as set forth in the appended claims.

REFERENCE SIGNS LIST 5, 90, 100 Fluid device mounting structure
6 Seal member
11, 12, 21 to 25, 71 to 77, 101 Fluid device
11a, 12a, 21a to 25a, 71a to 77a, 101a Connection part
11f, 12f, 21f to 25f, 71f to 77f, 101f Mounting groove
31, 91 Support assembly
32, 94 Holding frame (frame)
33, 96 Supporting frame (frame)
34, 110 Support member
35, 86, 87 Positioning member
41, 111 Main body
42 Coupling portion
50 Holding jig

The invention claimed is:

1. A fluid device mounting structure comprising:
a first fluid device;
a second fluid device; and
a support assembly on which the first and second fluid devices are mounted, the support assembly being configured by connecting four pipes in a lattice shape, wherein
the first fluid device includes a first connection part having an outer peripheral surface formed with a first mounting groove,
the second fluid device includes a second connection part having an outer peripheral surface formed with a second mounting groove, the first and second connection parts being of identical shapes,
the support assembly includes a support member attached to the first and second mounting grooves in a removable manner for supporting each connecting portion of the first and second connection parts by the support assembly,
the support member comprises:
a main body coupled with a pipe; and
coupling portions engaged with the main body while engaged in the first and second mounting grooves,
the first fluid device is mounted in a first pipe at a first side of the support assembly and the second fluid device is mounted in a second pipe at a second side of the support assembly opposite to the first side of the support assembly where the first fluid device is mounted, and
the first fluid device and the second fluid device are connected to each other.

2. The fluid device mounting structure according to claim 1, wherein,
the pipes include:
a supporting pipe for supporting the connecting portions via the support member;
a holding pipe for holding the supporting pipe; and
positioning members attached to each end of the supporting pipe for positioning the supporting pipe with respect to the holding pipe.

3. The fluid device mounting structure according to claim 1, wherein the support member is removably attached to the support assembly.

4. The fluid device mounting structure according to claim 1, wherein
the first and second mounting grooves are configured to allow a holding jig to be attached thereto to bring the first and second fluid devices closer to each other.

5. The fluid device mounting structure according to claim 1, wherein
the pipes have hollow portions and include housing holes through which at least either a wire or a pipe is housed in the hollow portions.

* * * * *